United States Patent
Takei

(10) Patent No.: US 6,885,354 B2
(45) Date of Patent: Apr. 26, 2005

(54) NON-CONTACT COMMUNICATION MEDIUM

(75) Inventor: Yoshiki Takei, Matsumoto (JP)

(73) Assignee: Seiko Epson Corporation (JP)

( * ) Notice: Subject to any disclaimer, the term of this patent is extended or adjusted under 35 U.S.C. 154(b) by 6 days.

(21) Appl. No.: 10/695,438

(22) Filed: Oct. 28, 2003

(65) Prior Publication Data

US 2004/0130500 A1 Jul. 8, 2004

(30) Foreign Application Priority Data

Oct. 28, 2002 (JP) ........................................ 2002-312765
Jan. 9, 2003 (JP) ........................................ 2003-003325
Jun. 9, 2003 (JP) ........................................ 2003-163979

(51) Int. Cl.$^7$ ................................................ H01Q 7/00
(52) U.S. Cl. ........................ 343/870; 343/866; 343/871; 343/787; 343/788; 343/700 MS
(58) Field of Search ....................... 343/700 MS, 787, 343/788, 866, 870, 871

(56) References Cited

U.S. PATENT DOCUMENTS

| | | | |
|---|---|---|---|
| 6,353,420 B1 | | 3/2002 | Chung ........................ 343/873 |
| 6,388,636 B1 | * | 5/2002 | Brown et al. ................ 343/866 |
| 6,407,669 B1 | * | 6/2002 | Brown et al. ............ 340/572.1 |
| 6,644,555 B1 | * | 11/2003 | Berney ........................ 235/492 |
| 2002/0186175 A1 | * | 12/2002 | Sanogo ........................ 343/788 |
| 2003/0184495 A1 | * | 10/2003 | Tomon ........................ 343/895 |
| 2004/0001029 A1 | * | 1/2004 | Parsche et al. ............. 343/866 |

FOREIGN PATENT DOCUMENTS

| | | | | |
|---|---|---|---|---|
| EP | 1 162 480 | | 6/2001 | |
| JP | 09-198481 | * | 7/1997 | .......... G06K/19/07 |
| JP | 11-328343 | * | 11/1999 | .......... G06K/19/07 |
| JP | 11-328843 | | 11/1999 | |
| JP | 2000-057289 | * | 2/2000 | .......... G06K/19/07 |
| JP | 2000-113144 | * | 4/2000 | .......... G06K/19/07 |
| JP | 2000-323626 | | 11/2000 | |
| JP | 2000-339427 | * | 12/2000 | .......... G06K/19/07 |
| JP | 2001-010264 | | 1/2001 | |
| JP | 2001-236479 | * | 8/2001 | .......... G06K/19/07 |
| JP | 2002-007985 | * | 1/2002 | .......... G06K/19/07 |
| JP | 2002-288611 | * | 10/2002 | .......... G06K/19/07 |

* cited by examiner

Primary Examiner—Thuy Vinh Tran
Assistant Examiner—Leith Al-Nazer
(74) Attorney, Agent, or Firm—Harness, Dickey & Pierce, P.L.C.

(57) ABSTRACT

A loop antenna is formed on one side of a circuit board and an IC chip is mounted on the same side of the circuit board. An inner end of the loop antenna is connected to an antenna connection terminal of the IC chip. An arm part provided with a first pad part, a second pad part, and a conducting wire for allowing conduction between the fist pad part and the second pad part is collapsibly provided in such a manner that, when the arm part is collapsed, an outer end of the loop antenna contacts the first pad part and an antenna connection terminal of the IC chip contacts the second pad part.

30 Claims, 16 Drawing Sheets

NON-CONTACT COMMUNICATION MEDIUM

BACKGROUND OF THE INVENTION

1. Technical Field

The present invention relates to a non-contact communication medium in which a loop antenna made of a conductor is formed on a circuit board and in which a communication circuit is mounted on the circuit board, more specifically, to a non-contact communication medium suitable for facilitating the production and for preventing cracking in the loop antenna, furthermore to a non-contact communication medium suitable for recycling, for facilitating the production, and for preventing cracking in a bridge coupling part of the loop antenna, and even furthermore to a non-contact communication medium suitable for improving the antenna efficiency and for easily adjusting the resonance frequency of the communication circuit.

2. Related Art

Conventionally, for example, an electronic tag disclosed in Japanese Unexamined Patent Application Publication No. 9-198481 (hereinafter, referred to as a first conventional example), a remote card disclosed in Japanese Unexamined Patent Application Publication No. 11-328343 (hereinafter, referred to as a second conventional example), and a non-contact IC card disclosed in Japanese Unexamined Patent Application Publication No. 2000-57289 (hereinafter, referred to as a third conventional example) are included in non-contact IC tags for RFID (Radio Frequency IDentification) or the like.

In the first conventional example, since each conducting part of a transmitting and receiving antenna of the electronic tag is formed by conductive paste, man-hours for assembling a responder, the thickness, and the cost are reduced as compared with an electronic tag using a known coil antenna made of a copper wire. Also, for the formation of a loop antenna, an insulating resin layer is provided on a first conducting part between the innermost circumference and the outermost circumference of the first conducting part arranged in a spiral form, and a second conducting part for connecting the innermost circumference to an IC chip is provided on the insulating resin layer. Thus, a thin and low-cost electronic tag provided with a loop antenna can be realized.

In the second conventional example, the remote card comprises a single-sided flexible circuit board, an LSI mounted on the single-sided flexible circuit board, and an antenna circuit formed on the signal-sided flexible circuit board. One end of the antenna circuit is connected to the LSI. The remote card also comprises one land formed on the single-sided flexible circuit board and connected to the other end of the antenna circuit, a foldable arm member provided on the single-sided flexible circuit board, and the other land formed on the arm member and connected to the LSI through a circuit pattern. Folding the arm member causes the one land to be connected to the other land. Accordingly, easy and low-cost production can be achieved.

In the third conventional example, the non-contact IC card comprises an antenna pattern, a pattern A, and an IC that are formed on a front surface of an antenna sheet. The non-contact IC card also comprises a slit A formed in the antenna sheet and located in a position near the other end of the antenna pattern and slits B and C formed in the antenna sheet and located in positions near the other end of the pattern A. The slit A is provided to fold the antenna sheet in such a manner that the other end of the antenna pattern is located at the rear surface of the antenna sheet and below the other end of the pattern A. The slits B and C are provided to electrically connect the other end of the antenna pattern to the other end of the pattern A by threading the leading edge of the folded bridge part from the rear surface to the front surface. Accordingly, easy and low-cost production can be achieved.

Also, conventionally, non-contact IC tags for RFID (Radio Frequency IDentification) or the like are widely known in which a loop antenna made of a conductor is formed on a circuit board and in which an IC chip is mounted on the circuit board, the loop antenna being connected to antenna connection parts of the IC chip. Here, the IC chip is, in general, mounted on the circuit board through an anisotropic conductive sheet or the like. Technologies for mounting an IC chip on a circuit board through an anisotropic conductive sheet or the like are, for example, disclosed in Japanese Unexamined Patent Application Publication No. 2000-113144 (hereinafter, referred to as a fourth conventional example), Japanese Unexamined Patent Application Publication No. 2000-323626 (hereinafter, referred to as a fifth conventional example), and Japanese Unexamined Patent Application Publication No. 2000-339427 (hereinafter, referred to as a sixth conventional example).

In the fourth conventional example, a non-contact IC card comprises a circuit board provided with an antenna coil and an IC chip arranged on the circuit board. The IC chip is arranged so as to straddle the antenna coil. The width of at least a part of the antenna coil is reduced so that the distance between a connection terminal at the inner circumference and a connection terminal at the outer circumference of the antenna coil is approximately equal to the distance between connection bumps of the IC chip, the bumps being provided to be connected to the connection terminals. Part of a plurality of traces of the antenna coil, which is straddled by the IC chip, is arranged so as to avoid portions that interfere with information transmission. The connection terminals of the antenna coil are directly connected face-down to the connection bumps of the IC chip, with an anisotropic conductive adhesion layer therebetween.

In the fifth conventional example, a semiconductor module comprises a bare IC chip, a lead terminal directly connected to a pad part of the IC chip, and sealing resin for coating around the IC chip including part of the lead terminal. At the rear surface of the IC chip, a thin resin film is formed only on a peripheral part including an edge part and a chip exposing part that is uncoated with the sealing resin is arranged at the center. The entire peripheral surface of the IC chip is coated with the sealing resin.

In the sixth conventional example, for stress relief and protection of a lead connection part, an IC chip with a lead is sealed with resin in such a manner that the shape of the sealed chip part is curved. For the stress relief against a concentrated load and a bend load, combined sealing is performed using a high elastic modulus resin for an inner layer sealing resin and using a low elastic modulus resin for an outer layer sealing resin. The sealing length of the inner layer sealing resin is set to be longer than that of the outer layer sealing resin, thus preventing the disconnection of lead wiring.

Also, conventionally, in non-contact IC tags for RFID (Radio Frequency IDentification) or the like, the resonance frequency of a non-contact IC tag must be adjusted to the resonance frequency of a responder, due to variations or the like of the characteristics of a loop antenna and an IC constituting the non-contact IC tag. Technologies for such an adjustment are disclosed, for example, in Japanese Unexamined Patent Application Publication No. 2001-10264 (hereinafter, referred to as a seventh conventional example), Japanese Unexamined Patent Application Publication No. 2002-7985 (hereinafter, referred to as an eighth conventional example), and Japanese Unexamined Patent Application Publication No. 2002-288611 (hereinafter, referred to as a ninth conventional example).

In the seventh conventional example, a non-contact IC card capable of non-contact communication with an external reader/writer comprises a resonance circuit in a circuit board of the card, the resonance circuit including an antenna coil and a planar adjusting resistor. Adjustment of the resistance of the adjusting resistor in the resonance circuit enables adjustment of the sharpness (Q) of the resonance circuit to ensure good communication conditions. Furthermore, provision of an adjusting capacitor enables adjustment of the resonance frequency. In order to adjust the antenna characteristics, part of a plurality of circuits arranged so as to be branched off from the antenna coil is cut, thereby adjusting the sharpness.

In the eighth conventional example, a card circuit board made of a polyvinyl chloride resin sheet or the like, a wire-wound antenna coil provided on the card circuit board, a resonance frequency adjusting part provided at the leading edge of the antenna coil, and polyvinyl chloride resin sheets bonded to the top and bottom of the resin circuit board by means of heat lamination processing are provided. A conductive layer is formed on the surface of the resin sheet provided on the upper side of the resin circuit board in such a manner that the conductive layer overlaps capacitor patterns that constitute the resonance frequency adjusting part and that are formed on the resin circuit board. Forming a capacitor by the capacitor patterns and the conductive layer and adjusting the capacitance enables adjustment of the resonance frequency of the non-contact IC card.

In the ninth conventional example, a non-contact IC module, a wound copper wire antenna connected to the IC module and performing communication with an external communication apparatus, and a capacitor for changing the resonance frequency of the antenna are provided. The capacitor is formed by the copper wire antenna, and its capacitance is adjusted by the interval (pitch) of the copper wires.

However, in the first conventional example, since the insulating resin layer is provided on the first conducting part between the innermost circumference and the outermost circumference of the loop antenna and the second conducting part for connecting the innermost circumference to the IC chip is provided on the insulating resin layer, there is a problem in that the complicated production process makes the production difficult.

Also, in the second and third conventional examples, the structure in which an arm part comprising a conducting part for connecting the other end of the loop antenna to the IC chip is provided and in which collapsing the arm part causes the other end of the loop antenna to be connected to the IC chip causes a problem that stress applied to the folding part of the arm part of the loop antenna is likely to cause cracking.

Also, in view of recycling non-contact IC tags for RFID or the like, the following problems may occur in the fourth to sixth conventional examples described above in which an IC chip is mounted on a circuit board through an anisotropic conductive sheet or the like. First, since an IC chip on which data is stored is mounted on a circuit board, data may be leaked out in the process of recycling. Thus, it is desirable that the IC chip be removable from the circuit board in recycling. Second, although a loop antenna portion is easy to recycle due to its uncomplicated structure, an IC chip must be removed in order to recycle only the loop antenna portion, and this results in more problems.

Also, in the seventh to ninth conventional examples, a capacitor part of a resonance circuit provided inside of a card circuit board interferes with electromagnetic waves, thus causing a problem that the sharpness (Q value) is reduced.

Also, in the sixth conventional example described above, since the capacitance is adjusted by a pitch between the copper wires, there is a problem in that various types of circuit boards must be prepared depending on the pitch.

Accordingly, the present invention is designed by focusing on such problems of the conventional technologies, and a first object of the present invention is to provide a non-contact communication medium suitable for facilitating the production and for preventing cracking in a loop antenna.

Also, a second object of the present invention is to provide a non-contact communication medium suitable for recycling, for facilitating the production, and for preventing cracking in a bridge coupling part of the loop antenna.

Furthermore, a third object of the present invention is to provide a non-contact communication medium suitable for improving the antenna efficiency and for easily adjusting the capacitance of a capacitor in a resonance circuit.

SUMMARY

In order to achieve the first object, according to Invention 1, in a non-contact communication medium, a loop antenna made of a conductor is formed on one side of a circuit board and a communication circuit is mounted on the one side of the circuit board. One end of the loop antenna is connected to one antenna connection part of the communication circuit. An arm part provided with a first pad part, a second pad part, and a conducting part for allowing conduction between the first pad part and the second pad part is collapsibly provided in such a manner that, when the arm part is collapsed, the other end of the loop antenna contacts the first pad part and the other antenna connection part of the communication circuit contacts the second pad part.

With this arrangement, since collapsing the arm part causes the contact between the other end of the loop antenna and the first pad part and the contact between the other antenna connection part of the communication circuit and the second pad part, the other end of the loop antenna is electrically connected to the other antenna connection part of the communication circuit through the first pad part, the conducting part, and the second pad part.

Thus, since there is no need to provide a conducting part at a folding part of the arm part, the possibility of cracking in the loop antenna can be reduced. Although a conducting part may be provided at the folding part of the arm part, since the other end of the loop antenna is, after all, electrically connected by connection of the pads, cracking in the folding part has little influence on reliability.

Also, in view of production, merely providing the arm part provided with the first pad part, the second pad part, and the conducting part and forming the loop antenna, the communication circuit, and the arm part on the one side of the circuit board simplifies the production process.

Here, the antenna connection parts of the communication circuit are a part for connecting one end of the loop antenna to the communication circuit and a part for connecting the other end of the loop antenna to the communication circuit. The antenna connection parts may be, for example, terminals for antenna connection provided at the communication circuit or conducting wires protruding from the communication circuit for connecting to the loop antenna.

Also, in a case where the other end of the loop antenna and the first pad part are arranged with the folding part of the arm part therebetween, a conducting part may be formed between them so as to straddle the folding part of the arm part or such a conducting part may not be formed. In the former case, although cracking may occur in the folding part of the arm part, the conduction between the other end of the loop antenna and the first pad part can be ensured to some extent even if a failure to collapse the arm part or the like causes an unsuccessful pad connection.

Also, in a case where the other antenna connection part of the communication circuit and the second pad part are arranged with the folding part of the arm part therebetween, a conducting part may be formed between them so as to straddle the folding part of the arm part or such a conducting part may not be formed.

In the former case, although cracking may occur in the folding part of the arm part, the conduction between the other antenna connection part of the communication circuit and the second pad part can be ensured to some extent even if a failure to collapse the arm part causes an unsuccessful pad connection.

The arm part may be formed integrally with the circuit board. Alternatively, the arm part and the circuit board may be formed individually. In terms of facilitating the production, it is preferable that the arm part be formed integrally with the circuit board by, for example, forming the arm part as part of the circuit board.

The arm part may be provided inside of the loop antenna. Alternatively, the arm part may be provided outside of the loop antenna.

According to Invention 2, in the non-contact communication medium of Invention 1, a portion of the conducting part that contacts the loop antenna when the arm part is collapsed is subjected to insulation processing.

With this arrangement, since the portion of the conducting part that contacts the loop antenna when the arm part is collapsed is subjected to insulation processing, the possibility of electrical connection between the loop antenna and the conducting part when the arm part is collapsed can be reduced.

According to Invention 3, in the non-contact communication medium of Invention 1 or 2, the other end of the loop antenna is arranged as a pad part, and a portion of the other antenna connection part that contacts the second pad part when the arm part is collapsed is arranged as a pad part.

With this arrangement, since collapsing the arm part causes the contact between the pad part of the other end of the loop antenna and the first pad part and the contact between the pad part of the other antenna connection part of the communication circuit and the second pad part, the other end of the loop antenna is electrically connected to the other antenna connection part of the communication circuit through the pad part of the other end of the loop antenna, the first pad part, the conducting part, the second pad part, and the pad part of the other antenna connection part.

Thus, due to the contact between the pad part of the other end of the loop antenna and the first pad part, the conduction between the other end of the loop antenna and the first pad part is relatively ensured. Also, due to the contact between the pad part of the other antenna connection part of the communication circuit and the second pad part, the conduction between the other antenna connection part of the communication circuit and the second pad part is relatively ensured.

According to Invention 4, in the non-contact communication medium of any one of Inventions 1 to 3, the arm part is provided inside of the loop antenna.

With this arrangement, since the arm part is provided inside of the loop antenna, there is no need to keep an area outside the non-contact communication medium in order to form the arm part. Thus, in a case where a plurality of circuit boards is cut out from a single circuit board, more circuit boards can be cut out from the single circuit board than a case where circuit boards having the structure in which the arm part is formed outside the non-contact communication medium are cut out from a single circuit board with the same size.

According to Invention 5, in the non-contact communication medium of Invention 4, the arm part is removably formed as part of the circuit board.

With this arrangement, the arm part can be collapsed by removing part of the circuit board. Since the arm part is formed as part of the circuit board, the arm part can be produced integrally with the circuit board.

According to Invention 6, in the non-contact communication medium of Invention 5, a magnetic core is installed in a removal hole of the arm part, the removal hole being formed in the circuit board when the arm part is collapsed.

With this arrangement, since the magnetic core is installed in the removal hole of the arm part which is formed in the circuit board when the arm part is collapsed, the inductance of the loop antenna is increased.

According to Invention 7, in the non-contact communication medium of Invention 6, the magnetic core is a magnetic material whose magnetic permeability is higher than atmosphere.

With this arrangement, since the magnetic core is a magnetic material whose magnetic permeability is higher than atmosphere, the inductance of the loop antenna is increased.

According to Invention 8, in the non-contact communication medium of any one of Inventions 1 to 7, the communication circuit is mounted in a position of the one side of the circuit board that overlaps the arm part when the arm part is collapsed. Also, a heat-radiating material or a heat-absorbing material is provided in a position of the arm part that overlaps the communication circuit when the arm part is collapsed.

With this arrangement, since the heat-radiating material or the heat-absorbing material is provided in a position of the arm part that overlaps the communication circuit when the arm part is collapsed, collapsing the arm part causes the heat-radiating material or the heat-absorbing material to overlap the communication circuit. Thus, heat in the communication circuit can be diffused by the heat-radiating material or the heat-absorbing material.

According to Invention 9, in the non-contact communication medium of any one of Inventions 1 to 8, the communication circuit includes an information storage circuit to communicate information in the information storage circuit.

With this arrangement, since collapsing the arm part causes the contact between the other end of the loop antenna and the first pad part and the contact between the other antenna connection part of the communication circuit and the second pad part, the other end of the loop antenna is electrically connected to the other antenna connection part of the communication circuit through the first pad part, the conducting part, and the second pad part. Then, the information in the information storage circuit is communicated by the communication circuit via the loop antenna.

In order to achieve the second object, according to Invention 10, a non-contact communication medium includes a circuit board and an arm part. The arm part is removable from the circuit board by a removal hole, one end of a part of the circuit board being left, and is collapsible by the remaining one end functioning as a folding part. The non-contact communication medium also includes a communication circuit mounted on the arm part and a loop antenna made of a conductor and formed on the circuit board. By collapsing the arm part, one end of the loop antenna is electrically connected to a first antenna connection part provided at the communication circuit, and the other end of the loop antenna is electrically connected to a second antenna connection part provided at the communication circuit.

With this arrangement, since a portion of the circuit board on which the communication circuit is mounted is formed as the arm part, the entire arm part is removed for recycling. Thus, the communication circuit can be removed from the circuit board relatively easily.

Thus, recycling can be performed more easily than conventional examples.

Here, a conductive path including the loop antenna is required at least when the non-contact communication medium is used. For example, the conductive path is not necessarily arranged in the production or selling stage. The same is applied to a non-contact communication medium according to Invention 11.

The arm part may be provided inside of the loop antenna. Alternatively, the arm part may be provided outside of the loop antenna. The same is applied to the non-contact communication medium according to Invention 11.

According to Invention 11, a non-contact communication medium includes a circuit board and a loop antenna made of a conductor and formed on the circuit board. The non-contact communication medium also includes an arm part that is removable from the circuit board by a removal hole, one end of a part of the circuit board remaining, and that is collapsible by the remaining one end functioning as a folding part. The non-contact communication medium further includes a communication circuit mounted on the arm part, a first pad part formed on the same side as the one on which the communication circuit of the arm part is mounted, a second pad part formed on the same side as the one on which the communication circuit of the arm part is mounted in such a manner that the second pad part is connected to a second antenna connection part, a conducting part for allowing conduction between a first antenna connection part and the first pad part, a third pad part formed on an end located outside the loop antenna, and a fourth pad part formed on an end located inside the loop antenna. The arm part is provided in such a manner that, when the arm part is collapsed, the first pad part contacts the third pad part and the second pad part contacts the fourth pad part.

With this arrangement, since the communication circuit is mounted on the arm part, the entire arm part is removed from the circuit board for recycling. Thus, the communication circuit can be removed from the circuit board relatively easily.

Also, since collapsing the arm part causes the contact between the first pad part and the third pad part and the contact between the second pad part and the fourth pad part, one end of the loop antenna is electrically connected to one antenna connection part of the communication circuit through the third pad part, the first pad part, and the conducting part, and the other end of the loop antenna is electrically connected to the other antenna connection part of the communication circuit through the fourth pad part and the second pad part.

Thus, since there is no need to provide a conducting part at a folding part of the arm part, the possibility of cracking in a bridge coupling part of the loop antenna can be reduced.

Although a conducting part may be provided at the folding part of the arm part, since each of the one end and the other end of the loop antenna is, after all, electrically connected by connection of the pads, cracking in the folding part has little influence on reliability.

Also, in view of production, merely forming the first pad part, the second pad part, the third pad part, the fourth pad part, the conducting part, and the loop antenna on the one side of the circuit board simplifies the production process.

Thus, for recycling, the communication circuit can be removed from the circuit board by merely removing the entire arm part from the circuit board. Therefore, recycling can be preformed more easily than the conventional examples. Also, since there is no need to provide a conducting part at the folding part of the arm part, the possibility of cracking in the bridge coupling part of the loop antenna can be reduced as compared with the conventional examples.

Also, in view of production, merely forming the first pad part, the second pad part, the third pad part, the fourth pad part, the conducting part, and the loop antenna on the one side of the circuit board simplifies the production process and thus achieves a relatively easier production than the conventional examples.

In a case where the one end of the loop antenna and the first pad part are arranged with the folding part of the arm part therebetween or a case where the other end of the loop antenna and the second pad part are arranged with the folding part of the arm part therebetween, a conducting part may be formed between them so as to straddle the folding part of the arm part or such a conducting part may not be formed. In the former case, although cracking may occur in the folding part of the arm part, the conduction between the other end of the loop antenna and the first pad part can be ensured to some extent even if a failure to collapse the arm part or the like causes an unsuccessful pad connection.

According to Invention 12, in the non-contact communication medium of Invention 11, the arm part is collapsed, and the arm part and the circuit board are joined together by piercing the arm part with part of the circuit board.

With this arrangement, as compared with a case where the arm part and the circuit board are bonded together by an adhesive, the arm part can be removed from the circuit board only by removing the joint.

Thus, recycling can be performed more easily.

According to Invention 13, in the non-contact communication medium of Invention 11 or 12, when the arm part is collapsed and is joined to the circuit board, a notch formed at an outer edge of the joined portion of the circuit board is provided.

With this arrangement, since only the arm part can be held at the notch when the arm part is collapsed and is joined to the circuit board, the arm part can be easily removed from the circuit board.

Thus, recycling can be performed more easily.

According to Invention 14, in the non-contact communication medium of any one of Inventions 11 to 13, an insulation part that is subjected to insulation processing is provided at a portion of the conducting part that contacts the loop antenna when the arm part is collapsed.

With this arrangement, since the portion of the conducting part that contacts the loop antenna when the arm part is collapsed is subjected to insulation processing, the possibility of electrical connection between the loop antenna and the conducting part when the arm part is collapsed can be reduced.

According to Invention 15, in the non-contact communication medium of any one of Inventions 11 to 14, the arm part is provided inside of the loop antenna.

With this arrangement, since the arm part is provided inside of the loop antenna, there is no need to keep an area outside the non-contact communication medium in order to form the arm part. Thus, in a case where a plurality of circuit boards is cut out from a single circuit board, more circuit boards can be cut out from the single circuit board than a case where circuit boards having the structure in which the arm part is formed outside the non-contact communication medium are cut out from a single circuit board with the same size.

According to Invention 16, in the non-contact communication medium of Invention 15, the arm part is removably formed as part of the circuit board.

With this arrangement, the arm part can be collapsed by removing part of the circuit board. Since the arm part is formed as part of the circuit board, the arm part can be produced integrally with the circuit board.

Thus, even easier production can be achieved.

According to Invention 17, in the non-contact communication medium of Invention 16, when the arm part is collapsed, a magnetic core installed on the circuit board along the rim of the removal hole of the arm part, the removal hole being formed in the circuit board, is provided.

With this arrangement, since the magnetic core is installed in the removal hole of the arm part which is formed in the circuit board when the arm part is collapsed, the inductance of the loop antenna can be increased.

According to Invention 18, in the non-contact communication medium of Invention 17, the magnetic core is a magnetic material whose magnetic permeability is higher than atmosphere.

With this arrangement, since the magnetic core is a magnetic material whose magnetic permeability is higher than atmosphere, the inductance of the loop antenna can be further increased.

According to Invention 19, in the non-contact communication medium of any one of Inventions 11 to 18, the communication circuit includes an information storage circuit to communicate information in the information storage circuit.

With this arrangement, since collapsing the arm part causes the contact between the one end of the loop antenna and the first pad part and the contact between the other end of the loop antenna and the second pad part, the one end of the loop antenna is electrically connected to the one antenna connection part of the connection circuit through the first pad part, the conducting part, and the second pad part, and the other end of the loop antenna is electrically connected to the other antenna connection part of the communication circuit through the first pad part, the conducting part, and the second pad part. Then, the information in the information storage circuit is communicated by the communication circuit via the loop antenna.

In order to achieve the third object, according to Invention 20, in a non-contact communication medium, a loop antenna made of a conductor is formed on one side of a circuit board and a communication circuit is mounted on the one side of the circuit board. One end of the loop antenna is connected to one antenna connection part of a communication circuit. An arm part provided with a first pad part, a second pad part, and a conducting part for allowing conduction between the first pad part and the second pad part is collapsibly provided in such a manner that, when the arm part is collapsed, the other end of the loop antenna contacts the first pad part and the other antenna connection part of the communication circuit contacts the second pad part. Also, a conductive pattern of traces of a predetermined shape is provided on the arm part. The conductive pattern is provided in such a manner that, when the arm part is collapsed, a capacitor is formed by the conductive pattern and part of the loop antenna formed on the circuit board. The capacitor is used for the communication circuit.

With this arrangement, since collapsing the arm part causes the contact between the other end of the loop antenna and the first pad part and the contact between the other antenna connection part of the communication circuit and the second pad part, the other end of the loop antenna is electrically connected to the other antenna connection part of the communication circuit through the first pad part, the conducting part, and the second pad part. Furthermore, a capacitor is formed by the conductive pattern and the loop antenna on the circuit board, which function as electrodes. Thus, the capacitor constitutes the communication circuit.

Thus, since the capacitor is formed by the conductive pattern and the loop antenna on the circuit board, electromagnetic waves from the outside do not cause interference and the capacitor pattern can be reduced due to the arrangement described above. Thus, the sharpness (Q) of the communication circuit is improved and thus the antenna efficiency is improved. The sharpness Q can be obtained from the following equation (1).

$$Q=(1/R)\times C^{1/2}\times(1/L^{1/2}) \qquad (1)$$

Here, L represents the inductance of the loop antenna, R represents a resistance component, and C represents the capacitance of the capacitor.

Also, in order to form the capacitor by the conductive pattern and the loop antenna, for example, the conductive pattern may be provided in a position lower than a face where the arm part contacts the circuit board, so that the conductive pattern does not contact the loop antenna when the arm part is collapsed. Alternatively, the capacitor may be arranged by providing a non-conductive material or the like functioning as a dielectric on the conductive pattern, on the loop antenna or on both the surfaces of the conductive pattern and the loop antenna.

The communication circuit is provided for the non-contact communication medium to perform non-contact data communication with a reader/writer. For example, a non-contact communication medium and a reader/writer include respective resonance circuits and a signal having a predetermined frequency is communicated by resonance. In such a case, changing the capacitance of a capacitor in a resonance circuit of the non-contact communication medium allows the resonance frequency of the resonance circuit to be changed. Thus, by adjusting it to the resonance frequency of the resonance circuit of the reader/writer, both can be adjusted to the right conditions. The resonance frequency f (Hz) of a resonance circuit is represented by the following equation (2).

$$f = (1/2\pi) \times (1/(LC)^{1/2}) \qquad (2)$$

Also, a paste-like conductor that is patterned by screen printing, as well as a copper foil conductor or the like etched on the circuit board, is included in the conductive pattern.

According to Invention 21, in the non-contact communication medium of Invention 20, the conductive pattern of the predetermined shape is provided in such a manner that part of the conductive pattern is removable. Also, removing part of the conductive pattern allows adjustment of the capacitance of the capacitor.

With this arrangement, since the conductive pattern of the predetermined shape is provided in such a manner that part of the conductive pattern is removable, part of the conductive pattern can be removed. Thus, the size of the conductive pattern can be adjusted.

Thus, when the arm part is collapsed, the capacitance of the capacitor formed by the conductive pattern and the loop antenna on the circuit board can be adjusted.

According to Invention 22, in the non-contact communication medium of Invention 21, part of the partly removable conductive pattern is arranged to be removable in a predetermined shape unit.

With this arrangement, since part of the partly removable conductive pattern is arranged to be removable in the predetermined shape unit, the capacitance of the capacitor can be adjusted by removing the conductive pattern in the predetermined shape unit. Also, the capacitance can be adjusted more easily by indicating on the circuit board the difference between the capacitances of the predetermined shaped pattern and a predetermined shaped pattern whose part is removed.

According to Invention 23, in the non-contact communication medium of any one of Inventions 20 to 22, a portion of the conducting part that contacts the loop antenna when the arm part is collapsed is subjected to insulation processing.

With this arrangement, since the portion of the conducting part that contacts the loop antenna when the arm part is collapsed is subjected to insulation processing, the possibility of electrical connection between the loop antenna and the conducting part when the arm part is collapsed can be reduced. Also, the performance of the capacitor can be improved by insulation processing using a dielectric that is suitable for the capacitor formed by the conductive pattern and the loop antenna.

According to Invention 24, in the non-contact communication medium of any one of Inventions 20 to 23, the other end of the loop antenna is arranged as a pad part, and a portion of the other antenna connection part that contacts the second pad part when the arm part is collapsed is arranged as a pad part.

With this arrangement, since collapsing the arm part causes the contact between the pad part of the other end of the loop antenna and the first pad part and the contact between the pad part of the other antenna connection part of the communication circuit and the second pad part, the other end of the loop antenna is electrically connected to the other antenna connection part of the communication circuit through the pad part of the other end of the loop antenna, the first pad part, the conducting part, the second pad part, and the pad part of the other antenna connection part.

Thus, due to the contact between the pad part of the other end of the loop antenna and the first pad part, the conduction between the other end of the loop antenna and the first pad part is relatively ensured. Also, due to the contact between the pad part of the other antenna connection part of the communication circuit and the second pad part, the conduction between the other antenna connection part of the communication circuit and the second pad part is relatively ensured.

According to Invention 25, in the non-contact communication medium of any one of Inventions 20 to 24, the communication circuit is mounted on the arm part.

With this arrangement, since the communication circuit is mounted on the arm part, the entire arm part is removed from the circuit board for recycling. Thus, the communication circuit can be removed from the circuit board relatively easily.

Thus, for recycling, the communication circuit can be removed from the circuit board only by removing the entire arm part from the circuit board. Thus, recycling can be performed more easily than the conventional examples.

According to Invention 26, in the non-contact communication medium of any one of Inventions 20 to 25, the arm part is provided inside of the loop antenna.

With this arrangement, since the arm part is provided inside of the loop antenna, there is no need to keep an area outside the non-contact communication medium in order to form the arm part. Thus, in a case where a plurality of circuit boards for non-contact communication medium is cut out from a single circuit board, more circuit boards can be cut out from the single circuit board than a case where circuit boards having the structure in which the arm part is formed outside the non-contact communication medium are cut out from a single circuit board with the same size.

According to Invention 27, in the non-contact communication medium of Invention 26, the arm part is removably formed as part of the circuit board.

With this arrangement, the arm part can be collapsed by removing part of the circuit board. Since the arm part is formed as part of the circuit board, the arm part can be produced integrally with the circuit board.

According to Invention 28, in the non-contact communication medium of Invention 27, a magnetic core is installed in a removal hole of the arm part which is formed in the circuit board when the arm part is collapsed.

With this arrangement, since the magnetic core is installed in the removal hole of the arm part which is formed in the circuit board when the arm part is collapsed, the inductance of the loop antenna is increased.

According to Invention 29, in the non-contact communication medium of Invention 28, the magnetic core is a magnetic material whose magnetic permeability is higher than atmosphere.

With this arrangement, since the magnetic core is a magnetic material whose magnetic permeability is higher than atmosphere, the inductance of the loop antenna can be further increased.

According to Invention 30, in the non-contact communication medium of any one of Inventions 20 to 29, the arm part is collapsed, and the arm part and the circuit board are joined together by piercing the arm part with part of the circuit board.

With this arrangement, as compared with a case where the arm part and the circuit board are bonded together by an adhesive, the arm part can be removed from the circuit board only by removing the joint.

Thus, the capacitance of the capacitor can be adjusted easily. Also, recycling can be performed more easily.

According to Invention 31, in the non-contact communication medium of any one of Inventions 20 to 30, the communication circuit includes an information storage circuit to communicate information in the information storage circuit.

With this arrangement, when the arm part is collapsed since collapsing the arm part causes the contact between the other end of the loop antenna and the first pad part and the contact between the other antenna connection part of the communication circuit and the second pad part, the other end of the loop antenna is electrically connected to the other antenna connection part of the communication circuit through the first pad part, the conducting part, and the second pad part. Then, the information in the information storage circuit is communicated by the communication circuit via the loop antenna.

DETAILED DESCRIPTION

The embodiments of the present invention will now be described with reference to the drawings. FIGS. 1 to 5 show a non-contact communication medium according to a first embodiment of the present invention.

Figure 1:
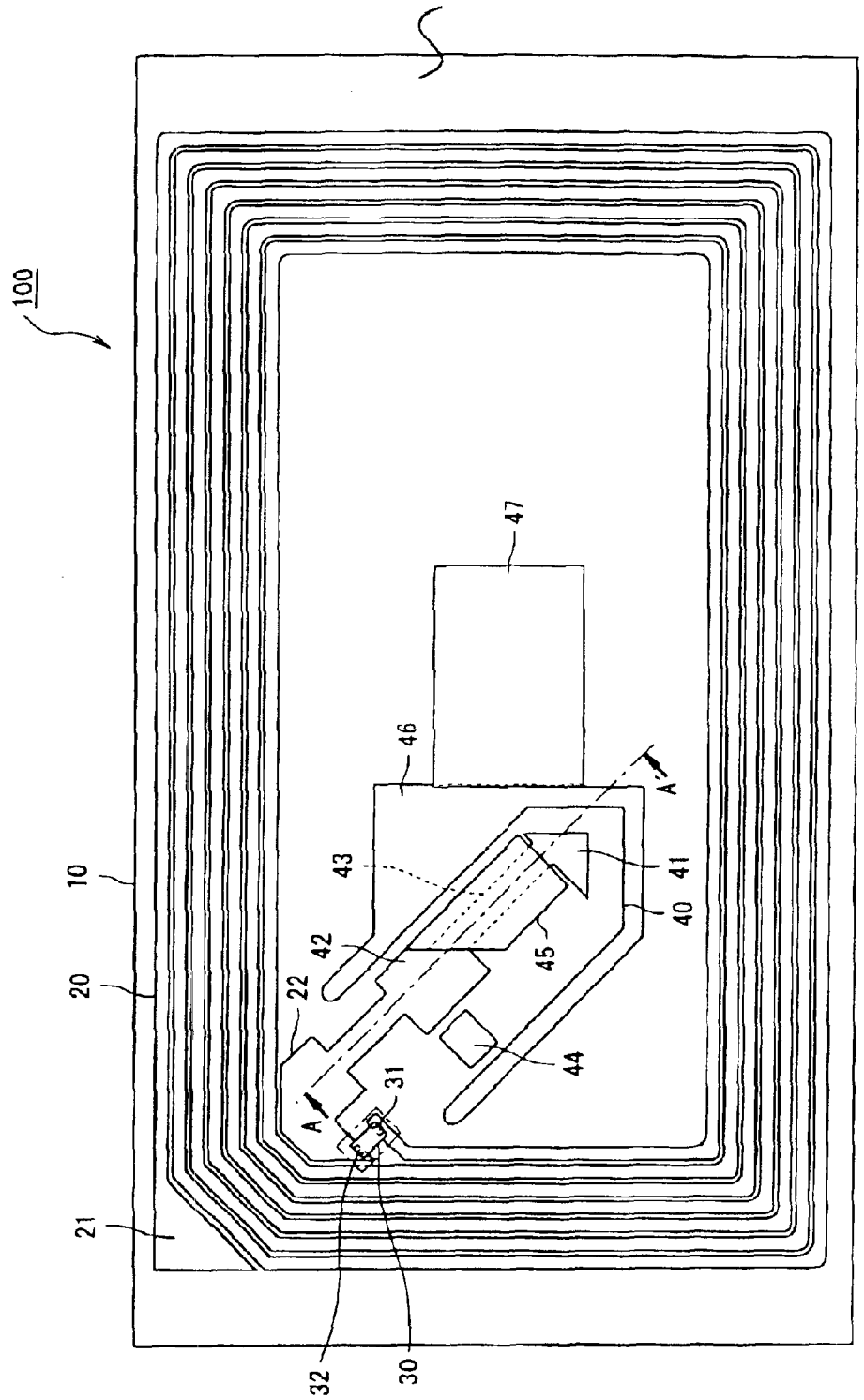
FIG. 1 is plan view of an RFID non-contact IC tag 100 when an arm part 40 is not collapsed.

In the first embodiment, the non-contact communication medium according to the present invention is applied to an RFID non-contact IC tag 100, as shown in FIG. 1.

Figure 2:
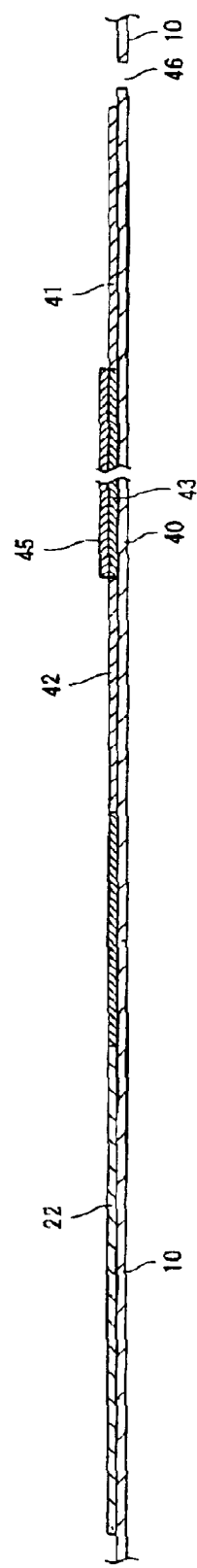
FIG. 2 is a cross-sectional view taken along the line A–A' in FIG. 1.
Figure 3:
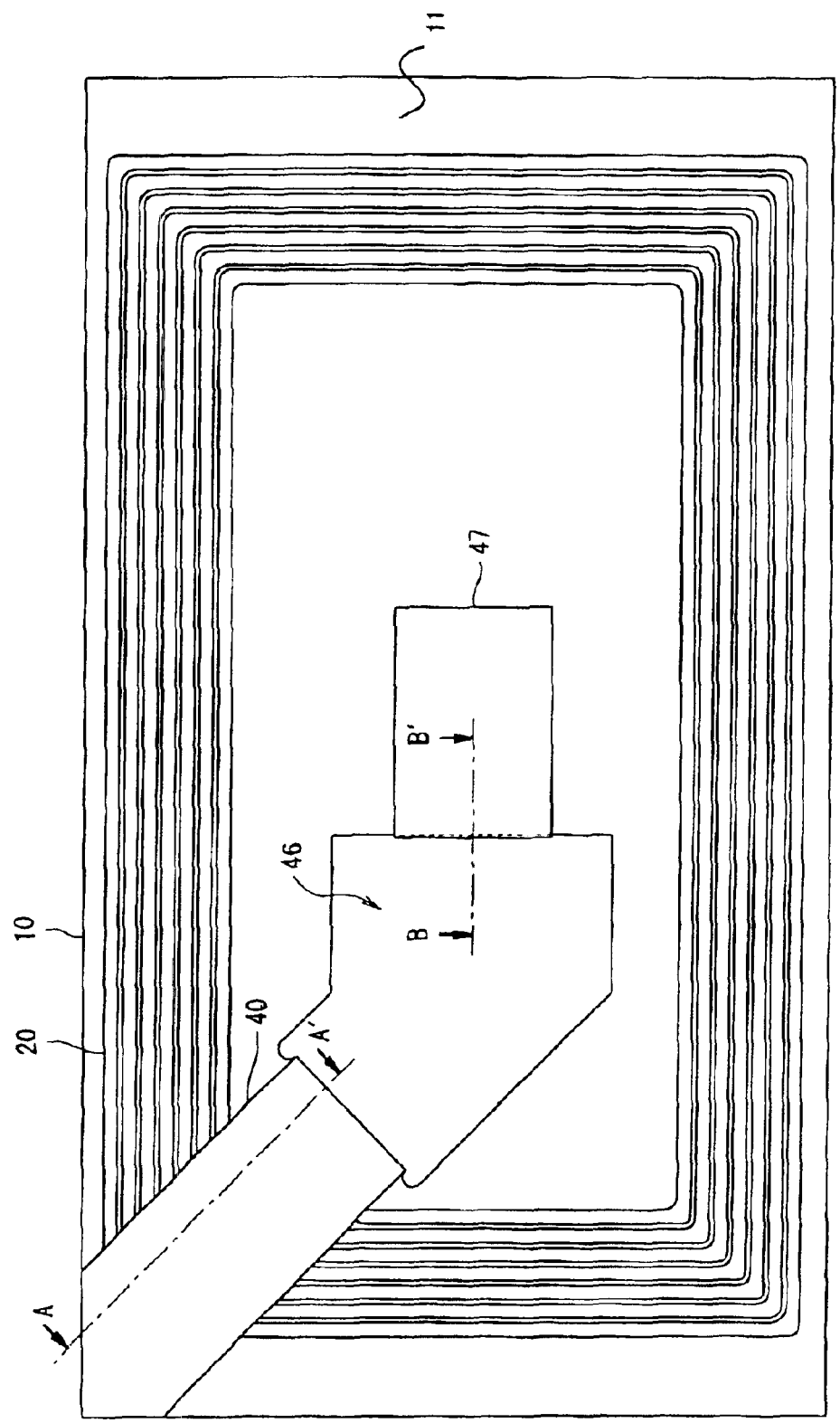
FIG. 3 is a plan view of the RFID non-contact IC tag 100 when the arm part 40 is collapsed.
Figure 4:
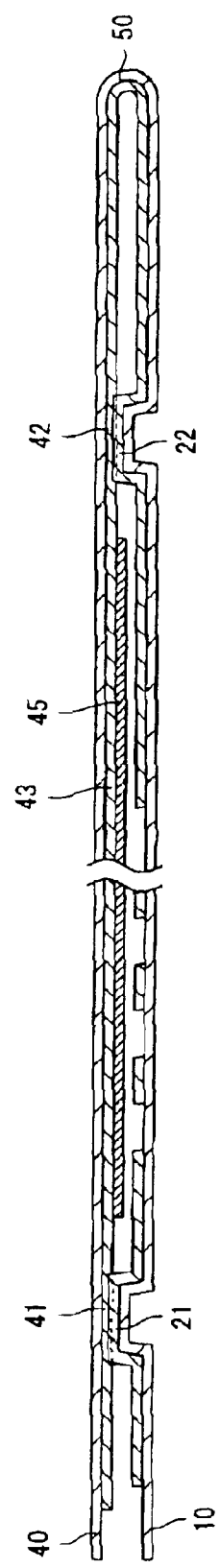
FIG. 4 is a cross-sectional view taken along the line A–A' in FIG. 3.

The structure of the RFID non-contact IC tag 100 according to the present invention will now be described with reference to FIGS. 1 to 4. FIG. 1 is a plan view of the RFID non-contact IC tag 100 when an arm part 40 is not collapsed. FIG. 2 is a cross-sectional view taken along the line A–A' in FIG. 1. FIG. 3 is a plan view of the RFID non-contact IC tag 100 when the arm part 40 is collapsed. FIG. 4 is a cross-sectional view taken along the line A–A' in FIG. 3.

As shown in FIGS. 1 and 3, the RFID non-contact IC tag 100 comprises a circuit board 10, a loop antenna 20 formed on one side 11 of the circuit board 10, an IC chip 30 mounted on the one side 11 of the circuit board 10, and the arm part 40 provided as part of the circuit board 10 on the inside of the loop antenna 20.

The IC chip 30 comprises an antenna connection terminal 31 for connecting to one end of the loop antenna 20, an antenna connection terminal 32 for connecting to the other end of the loop antenna 20, and an information storage circuit (not shown). The IC chip 30 performs radio communication of information in the information storage circuit via the loop antenna 20. Also, the IC chip 30 is mounted in a position on the one side 11 of the circuit board 10 in such a manner that the arm part 40 overlaps the IC chip 30 when the arm part 40 is collapsed.

The loop antenna 20 is made of a conducting wire and is arranged in a spiral form along the outer peripheral sides of the circuit board 10. The end located inside the loop antenna 20 (hereinafter, referred to as an inner end) is connected to the antenna connection terminal 31 of the IC chip 30, and the end located outside the loop antenna 20 (hereinafter, referred to as an outer end) has a pad part 21. Also, the antenna connection terminal 32 of the IC chip 30 is connected to a pad part 22.

As shown in FIGS. 2 and 4, the arm part 40 comprises a pad part 41, a pad part 42, a conducting wire 43 for allowing conduction between the pad parts 41 and 42, and a heat-radiating material 44. The arm part 40 is removably provided as part of the circuit board 10 in such a manner that, when the arm part 40 is collapsed, the pad part 41 contacts the pad part 21 and the pad part 42 contacts the pad part 22. Also, an insulating layer 45 is formed on the conducting wire 43. Moreover, the heat-radiating material 44 is provided in a position of the arm part 40 in such a manner that the heat-radiating material 44 overlaps the IC chip 30 when the arm part 40 is collapsed.

Figure 5:
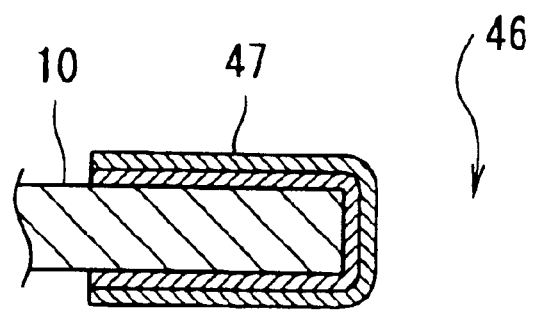
FIG. 5 is a cross-sectional view taken along the line B–B' in FIG. 3.

When the arm part 40 is collapsed, the removal of the arm part 40 creates a removal hole 46 in the circuit board 10. After collapsing the arm part 40, a magnetic core 47 is installed on the circuit board 10 along the rim of the removal hole 46. The magnetic core 47 can be formed by applying a mixture of adhesive materials and magnetic materials (for example, copper foil or aluminum foil) that have a magnetic permeability higher than atmosphere to one side of tape constituting the magnetic core 47, as shown in FIG. 5. The magnetic core 47 is installed so as to sandwich part of the removal hole 46. FIG. 5 is a cross-sectional view taken along the line B–B' in FIG. 3.

The operation according to this embodiment will now be described.

Since collapsing the arm part 40 causes the contact between the pad part 41 and the pad part 21 and the contact between the pad part 42 and the pad part 22, the outer end of the loop antenna 20 is electrically connected to the antenna connection terminal 32 of the IC chip 30 through the pad parts 21 and 41, the conducting wire 43, and the pad parts 42 and 22. Then, radio communication of information in the information storage circuit is performed by the IC chip 30 via the loop antenna 20.

Accordingly, there is no need to provide a conducting wire at a folding part 50 (in FIG. 4) of the arm part 40, thus reducing the possibility of cracking in the loop antenna 20. Although a conducting wire may be provided at the folding part 50 of the arm part 40, since the outer end of the loop antenna 20 is, after all, electrically connected by connection of the pads, cracking in the folding part 50 has little influence on reliability.

Also, since the pad part at the outer end of the loop antenna 20 contacts the pad part 41, the conduction between the outer end of the loop antenna 20 and the pad part 41 is relatively ensured. Also, since the pad part at the antenna connection terminal 32 of the IC chip 30 contacts the pad part 42, the conduction between the antenna connection terminal 32 of the IC chip 30 and the pad part 42 is relatively ensured.

Also, in view of production, merely providing the arm part 40 comprising the pad parts 41 and 42 and the conducting wire 43 and forming the loop antenna 20, the IC chip 30, and the arm part 40 on the one side 11 of the circuit board 10 simplifies the production process.

Also, the insulating layer 45 formed on the conducting wire 43 reduces the possibility of electrical connection between the loop antenna 20 and the conducting wire 43 when the arm part 40 is collapsed.

Also, since the arm part 40 is provided inside of the loop antenna 20, there is no need to keep an area outside the RFID non-contact IC tag 100 in order to form the arm part 40. Thus, in a case where a plurality of circuit boards 10 is cut out from a single circuit board, more circuit boards 10 can be cut out from the single circuit board than a case where circuit boards having the structure in which the arm part 40 is formed outside the RFID non-contact IC tag 100 are cut out from a single circuit board with the same size.

Also, since the magnetic core 47 is installed in the removal hole 46 that is formed in the circuit board 10 when the arm part 40 is collapsed, the inductance of the loop antenna 20 is increased.

Also, since the heat-radiating material 44 is provided in a position of the arm part 40 that overlaps the IC chip 30 when the arm part 40 is collapsed, collapsing the arm part 40 causes the heat-radiating material 44 to overlap the IC chip 30. Thus, heat in the IC chip 30 is diffused through the heat-radiating material 44.

Accordingly, in this embodiment, the loop antenna 20 is formed on the one side 11 of the circuit board 10 and the IC chip 30 is mounted on the one side 11 of the circuit board 10. The inner end of the loop antenna 20 is connected to the antenna connection terminal 31 of the IC chip 30. The arm part 40 comprising the pad part 41, the pad part 42, and the conducting wire 43 for allowing conduction between the pad part 41 and the pad part 42 is collapsibly provided in such a manner that, when the arm part 40 is collapsed, the outer end of the loop antenna 20 contacts the pad part 41 and the antenna connection terminal 32 of the IC chip 30 contacts the pad part 42.

Thus, since there is no need to provide a conducting wire at the folding part 50 of the arm part 40, the possibility of cracking in the loop antenna 20 can be reduced as compared with the conventional examples. Also, in view of production, merely providing the arm part 40 comprising the pad parts 41 and 42 and the conducting wire 43 and forming the loop antenna 20, the IC chip 30, and the arm part 40 on the one side 11 of circuit board 10 simplifies the production process and achieves a production relatively easier than the conventional examples.

Furthermore, in this embodiment, the insulating layer 45 is formed on the conducting wire 43.

Thus, the possibility of the electrical connection between the loop antenna 20 and the conducting wire 43 when the arm part 40 is collapsed can be reduced.

Furthermore, in this embodiment, the outer end of the loop antenna 20 is arranged as the pad part 21, and a portion of the antenna connection terminal 32 that contacts the pad part 42 when the arm part 40 is collapsed is arranged as the pad part 22.

Thus, since the outer end of the loop antenna 20 is electrically connected to the pad part 41 due to the contact of the pads, the conduction between the outer end of the loop antenna 20 and the pad part 41 is relatively ensured. Also, since the antenna connection terminal 32 of the IC chip 30 is electrically connected to the pad part 42 due to the contact of the pads, the conduction between the antenna connection terminal 32 of the IC chip 30 and the pad part 42 is relatively ensured.

Furthermore, in this embodiment, the arm part 40 is provided inside of the loop antenna 20.

Thus, in a case where a plurality of circuit boards 10 is cut out from a single circuit board, more circuit boards 10 can be cut out from the single circuit board than a case where circuit boards having the structure in which the arm part 40 is formed outside the RFID non-contact IC tag 100 are cut out from a single circuit board with the same size.

Furthermore, in this embodiment, the arm part 40 is removably formed as part of the circuit board 10.

Thus, the arm part 40 can be produced integrally with the circuit board 10. Therefore, even easier production can be achieved.

Furthermore, in this embodiment, the magnetic core 47 is installed in the removal hole 46 that is formed in the circuit board 10 when the arm part 40 is collapsed.

Thus, the inductance of the loop antenna 20 can be increased.

Furthermore, in this embodiment, the IC chip 30 is mounted in a position on the one side 11 of the circuit board 10 in such a manner that the arm part 40 overlaps the IC chip 30 when the arm part 40 is collapsed, and the heat-radiating material 44 is provided in a position of the arm part 40 that overlaps the IC chip 30 when the arm part 40 is collapsed.

Thus, since collapsing the arm part 40 causes the heat-radiating material 44 to overlap the IC chip 30, heat in the IC chip 30 is diffused through the heat-radiating material 44. Therefore, the influence of the heat on the IC chip 30 can be reduced.

A second embodiment of the present invention will now be described with reference to the drawings. FIGS. 6 to 12 show a non-contact communication medium according to the second embodiment of the present invention.

Figure 6:
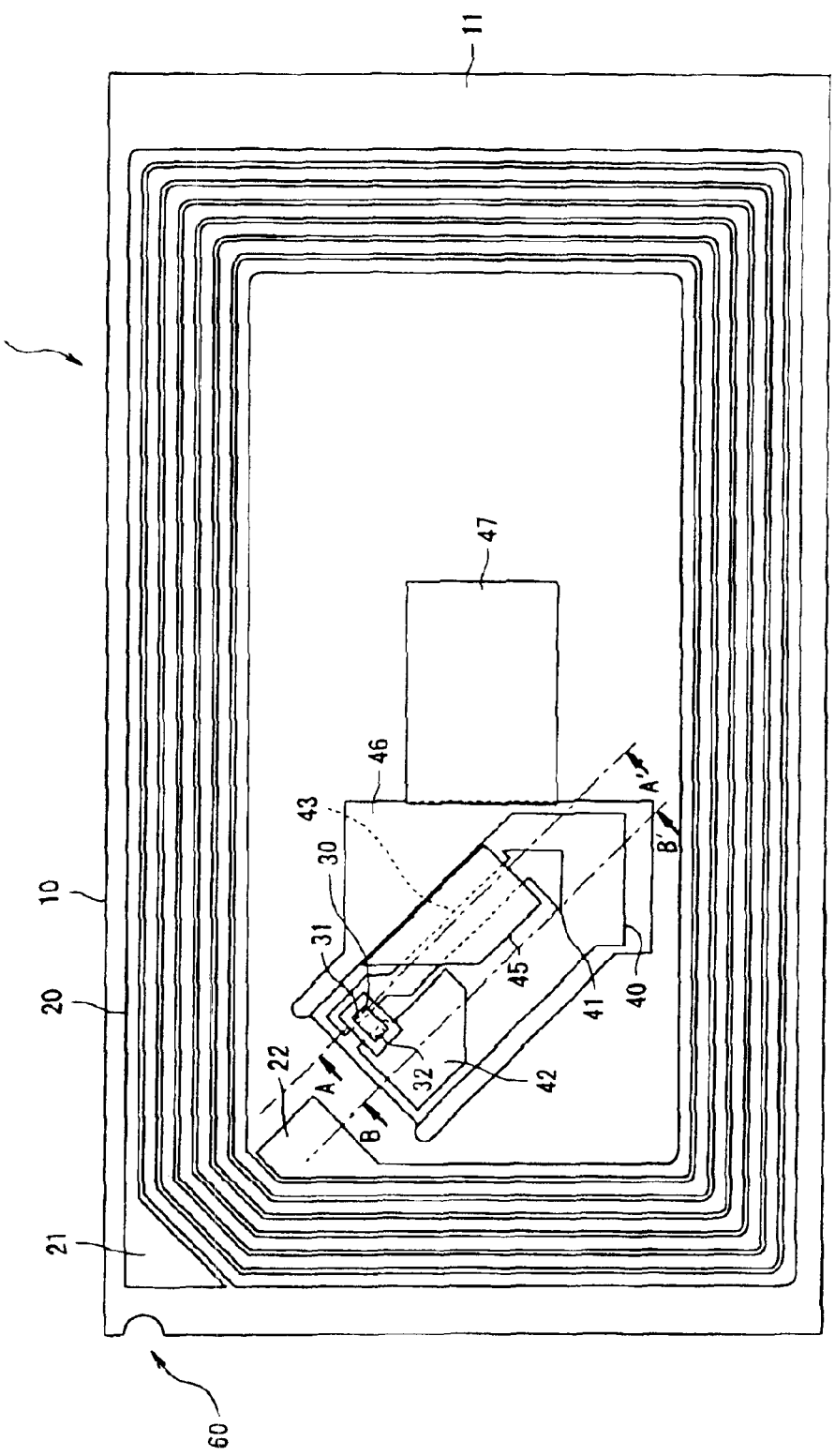
FIG. 6 is a plan view of an RFID non-contact IC tag 101 when the arm part 40 is not collapsed.

In this embodiment, the non-contact communication medium according to the present invention is applied to an RFID non-contact IC tag 101, as shown in FIG. 6.

The structure of the RFID non-contact IC tag 101 according to the present invention will be described with reference to FIGS. 6 to 11.

FIG. 6 is a plan view of the RFID non-contact IC tag 101 when the arm part 40 is not collapsed.

Figure 7:
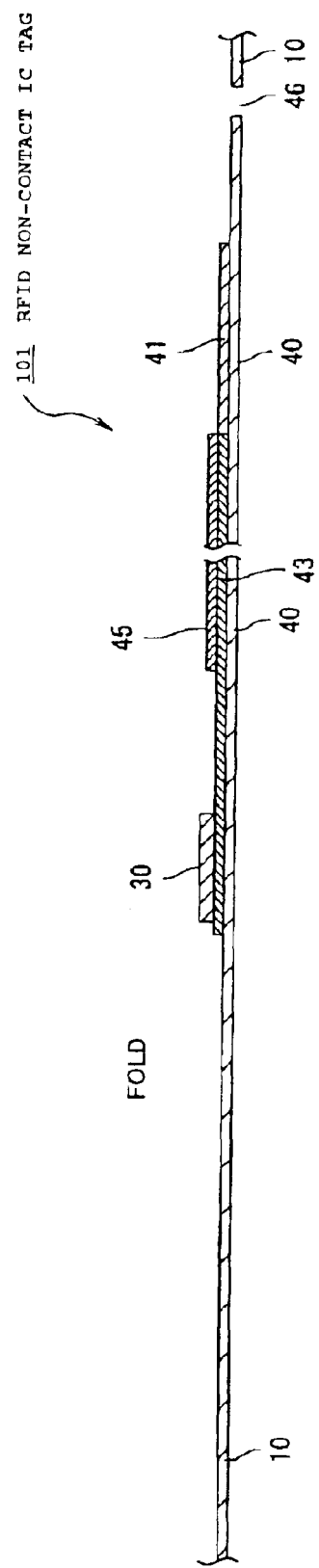
FIG. 7 is a cross-sectional view taken along the line A–A' in FIG. 6.

FIG. 7 is a cross-sectional view taken along the line A–A' in FIG. 6.

Figure 8:
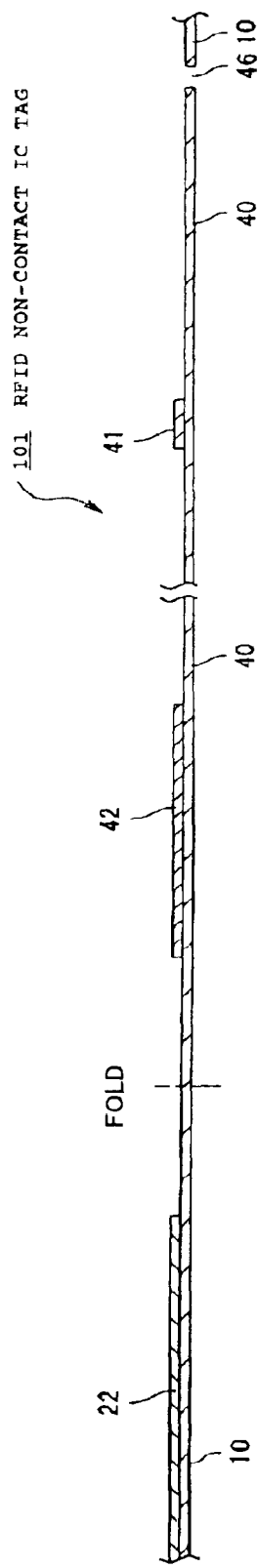
FIG. 8 is a cross-sectional view taken along the line B–B' in FIG. 6.

FIG. 8 is a cross-sectional view taken along the line B–B' in FIG. 6.

Figure 9:
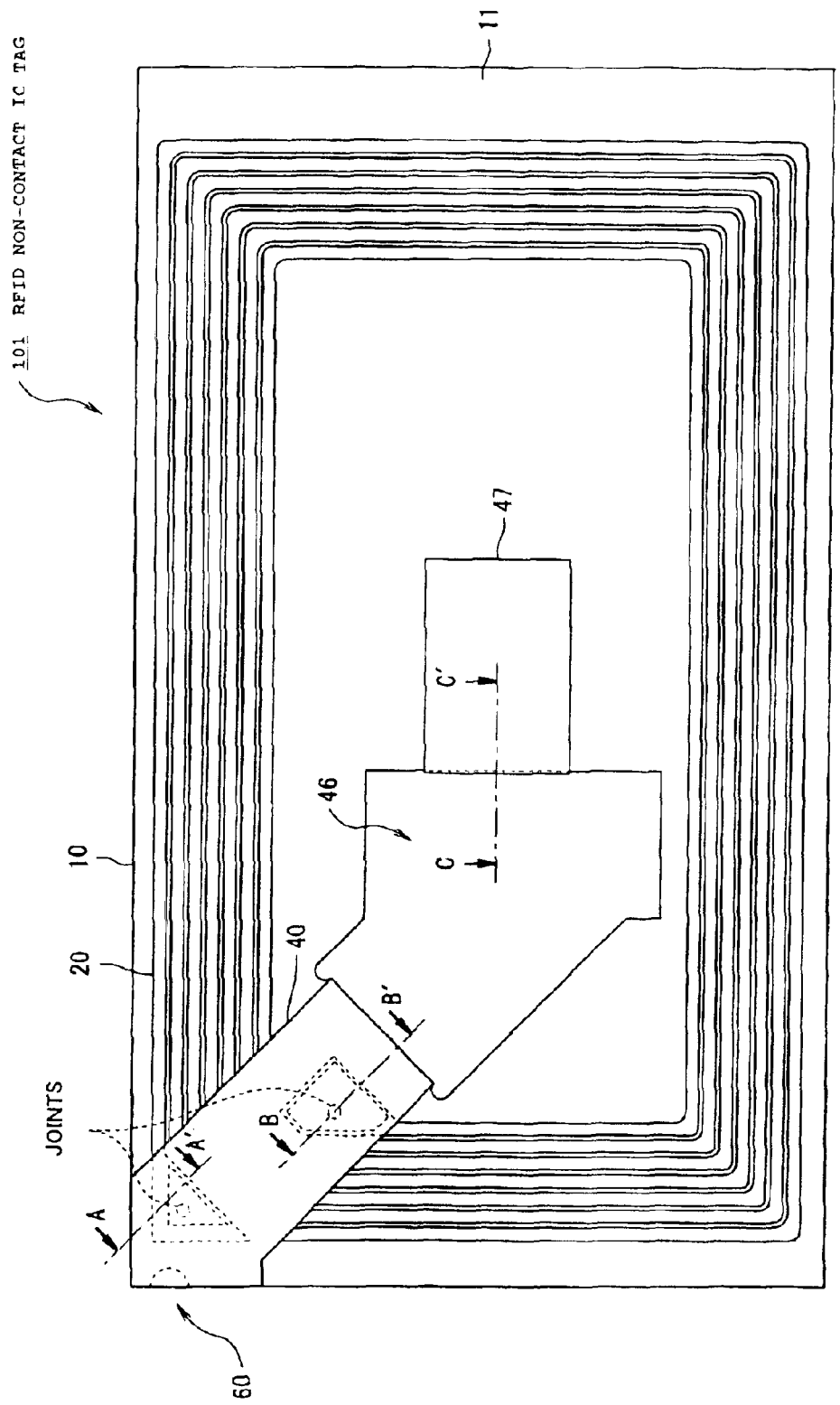
FIG. 9 is a plan view of the RFID non-contact IC tag 101 when the arm part 40 is collapsed.

FIG. 9 is a plan view of the RFID non-contact IC tag 101 when the arm part 40 is collapsed.

Figure 10:
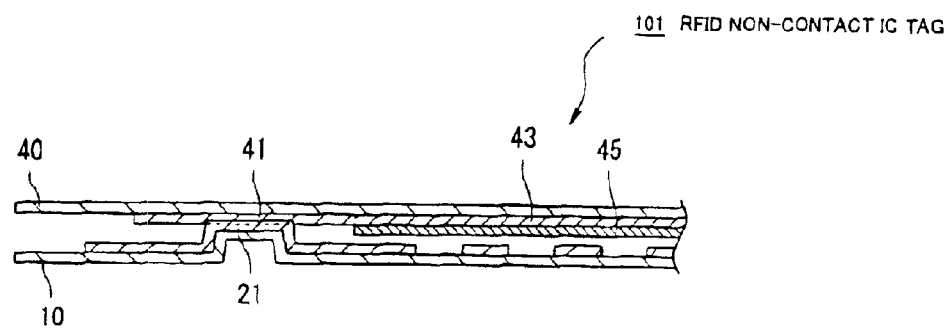
FIG. 10 is a cross-sectional view taken along the line A–A' in FIG. 9.

FIG. 10 is a cross-sectional view taken along the line A–A' in FIG. 9.

Figure 11:
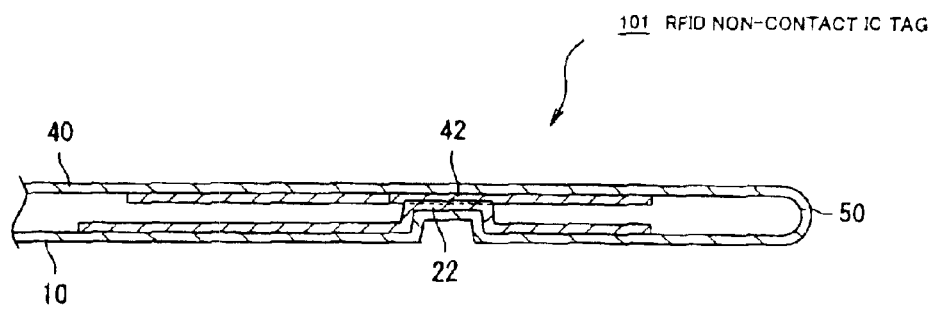
FIG. 11 is a cross-sectional view taken along the line B–B' in FIG. 9.

FIG. 11 is a cross-sectional view taken along the line B–B' in FIG. 9.

As shown in FIGS. 6 and 9, the RFID non-contact IC tag 101 comprises the circuit board 10, the loop antenna 20 formed on the one side 11 of the circuit board 10, the arm part 40 provided as part of the circuit board 10 on the inside of the loop antenna 20, and the IC chip 30 mounted on the arm part 40.

The IC chip 30 comprises the antenna connection terminal 31 for connecting to one end of the loop antenna 20, the antenna connection terminal 32 for connecting to the other end of the loop antenna 20, and the information storage circuit (not shown). The IC chip 30 performs radio communication of information in the information storage circuit via the loop antenna 20.

The loop antenna 20 is made of a conducting wire and is arranged in a spiral form along the outer peripheral sides of the circuit board 10. The end located inside the loop antenna 20 (hereinafter, referred to as an inner end) has the pad part 22, and the end located outside the loop antenna 20 (hereinafter, referred to as an outer end) has the pad part 21.

The arm part 40 is provided with the IC chip 30 and also comprises the pad part 41, the pad part 42, and the conducting wire 43 that are formed on the one side 11. The arm part 40 is removably provided as part of the circuit board 10. Since the pad part 41 is provided so as to correspond to the pad part 21, collapsing the arm part 40 causes the pad part 41 to contact the pad part 21, as shown in FIG. 10. When the arm part 40 is collapsed, the pad parts 41 and 21 are joined together by piercing the pad part 41 with part of the pad part 21. Also, since the pad part 42 is provided so as to correspond to the pad part 22, collapsing the arm part 40 causes the pad part 42 to contact the pad part 22, as shown in FIGS. 8 and 11. When the arm part 40 is collapsed, the pad parts 42 and 22 are joined together by piercing the pad part 42 with part of the pad part 22. The fold of the folding part 50 is half-punched or perforated so that the folding part 50 is easily folded for removing the arm part 40 and that the arm part 40 is easily removed from the circuit board 10.

The conducting wire 43 connects the pad part 41 to the antenna connection terminal 31 of the IC chip 30, and the antenna connection terminal 32 of the IC chip 30 is connected to the pad part 42. Also, the insulating layer 45 is formed on the conducting wire 43. The insulating layer 45 is made of a seal member or the like and is attached to a portion of the conducting wire 43 that contacts the loop antenna 20 when the arm part 40 is collapsed.

Also, a notch 60 is provided at an outer edge of the circuit board 10 where the arm part 40 and the circuit board 10 are joined together when the arm part 40 is collapsed, as shown in FIGS. 6 and 9. Since the notch 60 is provided in such a position, the arm part 40 can be removed from the circuit board 10 only by removing the joints, pinching a leading edge of the arm part 40 at the notch 60, and pulling the arm part 40. Thus, it is preferable that the notch 60 have a size approximately larger than or equal to a fingertip.

Figure 12:
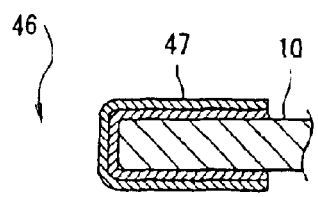
FIG. 12 is a cross-sectional view taken along the line C–C' in FIG. 9.

FIG. 12 is a cross-sectional view taken along the line C–C' in FIG. 9.

After collapsing the arm part 40, the magnetic core 47 is installed on the circuit board 10 along the rim of the removal hole 46. The magnetic core 47 can be formed by applying a mixture of adhesive materials and magnetic materials (for example, copper foil or aluminum foil) that have a magnetic permeability higher than atmosphere to one side of tape constituting the magnetic core 47, as shown in FIG. 12. The magnetic core 47 is installed so as to sandwich part of the circuit board 10.

The operation according to this embodiment will now be described.

Since collapsing the arm part 40 causes the contact between the pad part 41 and the pad part 21 and the contact between the pad part 42 and the pad part 22, the outer end of the loop antenna 20 is electrically connected to the antenna connection terminal 31 of the IC chip 30 through the pad parts 21 and 41, and the conducting wire 43. Also, the inner end of the loop antenna 20 is electrically connected to the antenna connection terminal 32 of the IC chip 30 through the pad parts 22 and 42. After the connection, the pad part 21 and the pad part 41 are joined together by piercing the pad part 41 with part of the pad part 21, and the pad part 22 and the pad part 42 are joined together by piercing the pad part 42 with part of the pad part 22. By such a joint, the IC chip 30 is connected to the loop antenna 20. Thus, radio communication of information in the information storage circuit is performed by the IC chip 30 via the loop antenna 20.

For recycling, the joints are removed and the arm part 40 is pulled by pinching a leading edge of the arm part 40 at the notch 60, so that the arm part 40 is removed from the circuit board 10. After removing the arm part 40 from the circuit board 10, the circuit board 10 is recycled and the arm part 40 is disposed of.

Accordingly, in this embodiment, the IC chip 30 is mounted on the arm part 40.

Thus, for recycling, the IC chip 30 can be removed from the circuit board 10 by merely removing the entire arm part 40 from the circuit board 10. Thus, recycling can be performed more easily than the conventional examples.

Furthermore, in this embodiment, the loop antenna 20 is formed on the one side 11 of the circuit board 10 and the arm part 40 that is provided with the IC chip 30 and that also comprises the pad part 41, the pad part 42, and the conducting wire 43 is collapsibly provided in such a manner that, when the arm part 40 is collapsed, the outer end of the loop antenna 20 contacts the pad part 41 and the inner end of the loop antenna 20 contacts the pad part 42.

Thus, there is no need to provide a conducting wire at the folding part 50 of the arm part 40. Therefore, the possibility of cracking in the loop antenna 20 is reduced compared with the conventional examples. Also, in view of production, merely forming the pad parts 21, 22, 41, and 42, the conducting wire 43, and the loop antenna 20 on the one side 11 of the circuit board 10 simplifies the production process and achieves a production relatively easier than the conventional examples.

Furthermore, in this embodiment, the arm part 40 is collapsed, and the arm part 40 and the circuit board 10 are joined together by piercing the arm part 40 with part of the circuit board 10.

Thus, as compared with a case where the arm part 40 and the circuit board 10 are bonded together by an adhesive, the arm part 40 can be removed from the circuit board 10 only by removing the joints.

Thus, further easier recycling can be achieved.

Furthermore, in this embodiment, the notch 60 is provided at an outer edge of the circuit board 10 where the arm part 40 and the circuit board 10 are joined together when the arm part 40 is collapsed.

Thus, when the arm part 40 is collapsed and the arm part 40 and the circuit board 10 are joined together, only the arm part 40 can be held at the notch 60. Thus, the arm part 40 is easily removed from the circuit board 10. Therefore, further easier recycling can be achieved. Also, by protruding a part of the arm part 40 from the circuit board 10, a similar effect can be achieved.

Furthermore, in this embodiment, the insulating layer 45 is formed on the conducting wire 43.

Thus, the possibility of electrical connection between the loop antenna 20 and the conducting wire 43 when the arm part 40 is collapsed can be reduced.

Furthermore, in this embodiment, the outer end of the loop antenna 20 is arranged as the pad part 21 and the inner end of the loop antenna 20 is arranged as the pad part 22.

Thus, since the outer end of the loop antenna 20 is electrically connected to the pad part 41 due to the contact of the pads, the conduction between the outer end of the loop antenna 20 and the pad part 41 is relatively ensured. Also, since the inner end of the loop antenna 20 is electrically connected to the pad part 42 due to the contact of the pads, the conduction between the inner end of the loop antenna 20 and the pad part 42 is relatively ensured.

Furthermore, in this embodiment, the arm part 40 is provided inside of the loop antenna 20.

Thus, in a case where a plurality of circuit boards 10 is cut out from a single circuit board, more circuit boards 10 can be cut out from the single circuit board than a case where circuit boards having the structure in which the arm part 40 is formed outside the RFID non-contact IC tag 101 are cut out from a single circuit board with the same size.

Furthermore, in this embodiment, the arm part 40 is removably formed as part of the circuit board 10.

Thus, the arm part 40 can be produced integrally with the circuit board 10. Therefore, further easier production can be achieved.

Furthermore, in this embodiment, the magnetic core 47 is installed on the circuit board 10 along the rim of the removal hole 46 formed in the circuit board 10 when the arm part 40 is collapsed.

Thus, the inductance of the loop antenna 20 can be increased.

A third embodiment of the present invention will now be described with reference to the drawings. FIGS. 13 to 19 show a non-contact communication medium according to the third embodiment of the present invention.

Figure 13:
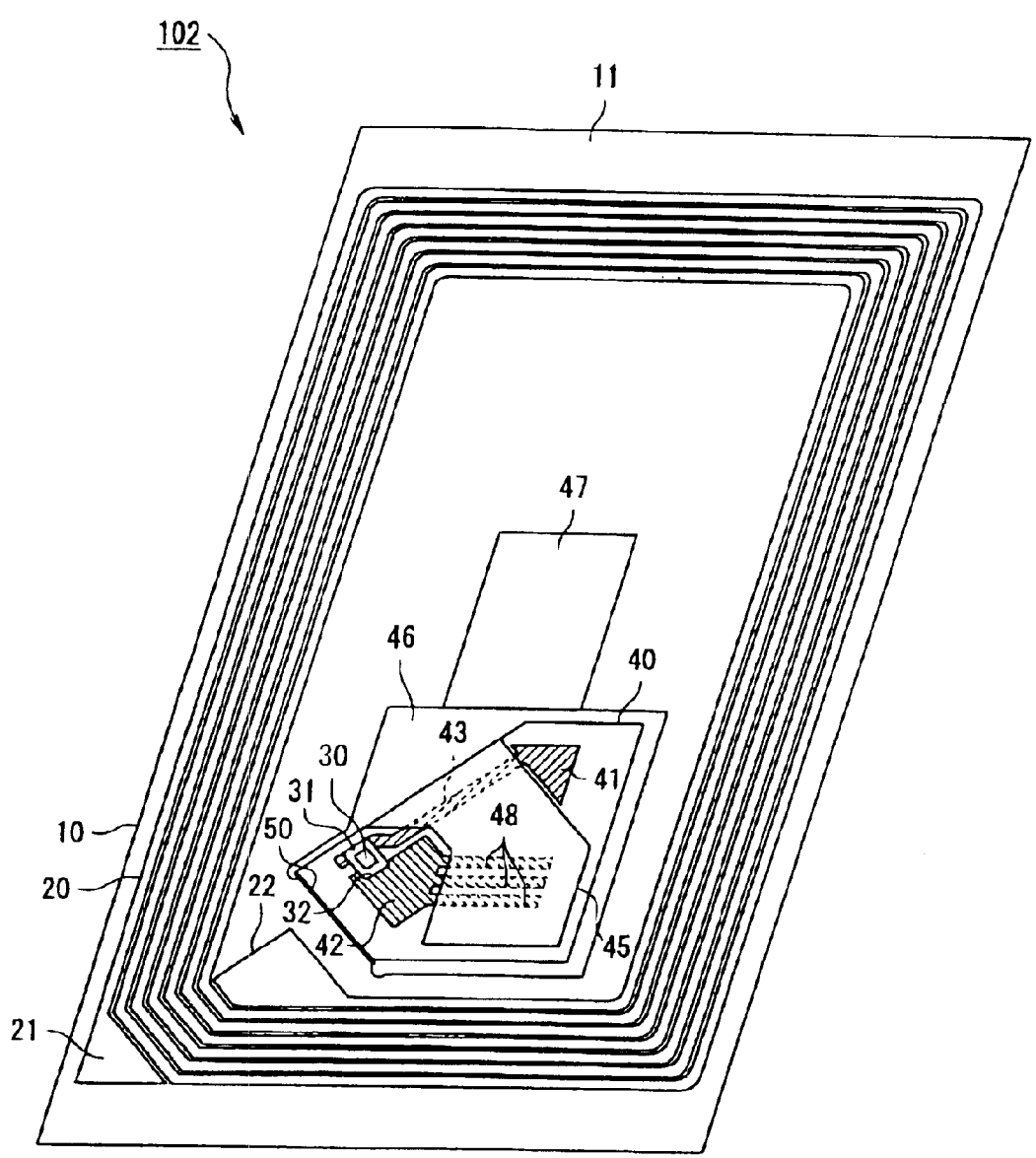
FIG. 13 is a plan view of an RFID non-contact IC tag 102 when the arm part 40 is not collapsed.

In this embodiment, the non-contact communication medium according to the present invention is applied to an RFID non-contact IC tag 102, as shown in FIG. 13.

The structure of the RFID non-contact IC tag 102 according to the present invention will be described with reference to FIGS. 13 and 14.

FIG. 13 is a plan view of the RFID non-contact IC tag 102 when the arm part 40 is not collapsed.

Figure 14:
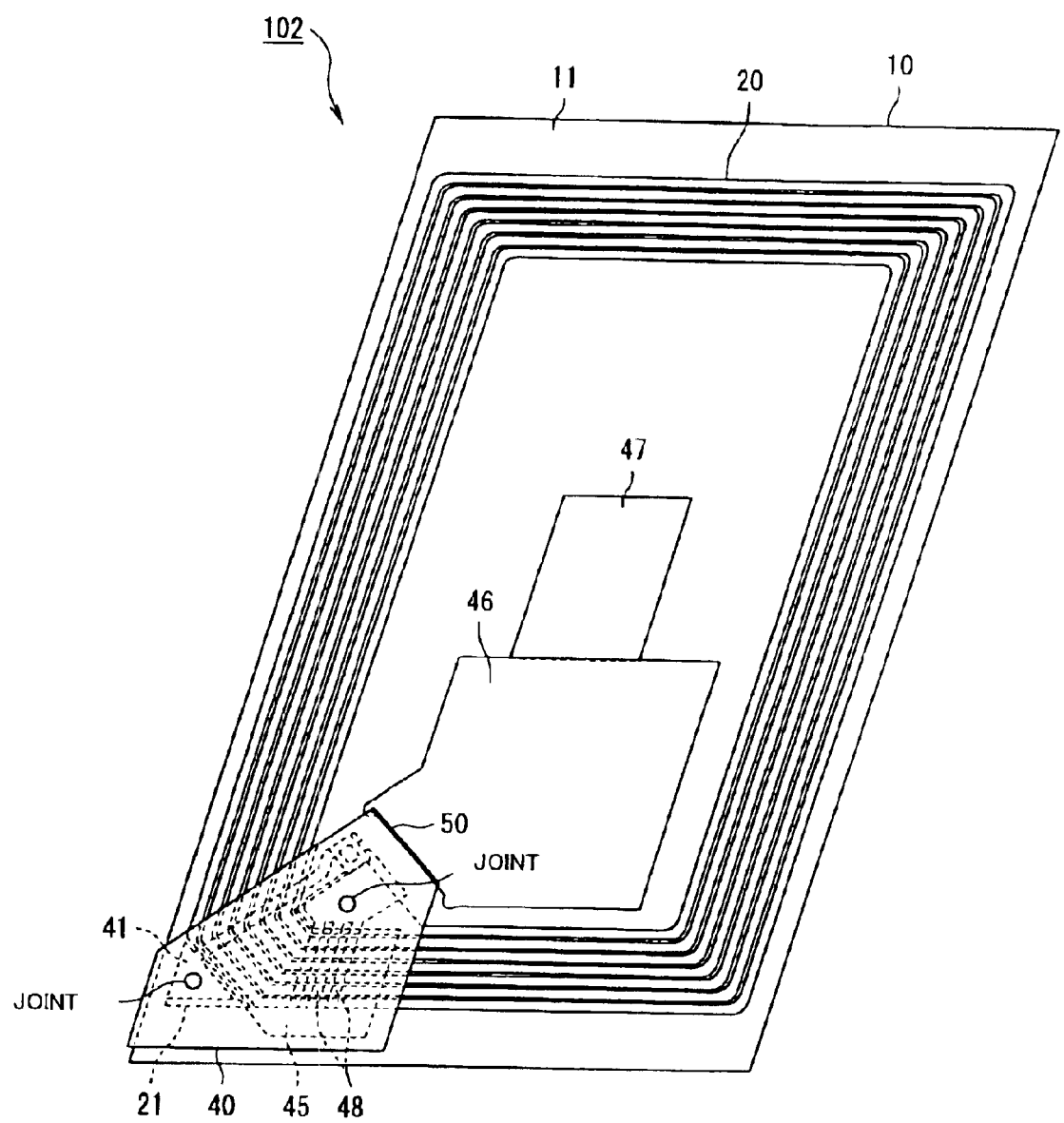
FIG. 14 is a plan view of the RFID non-contact IC tag 102 when the arm part 40 is collapsed.

FIG. 14 is a plan view of the RFID non-contact IC tag 102 when the arm part 40 is collapsed.

As shown in FIGS. 13 and 14, the RFID non-contact IC tag 102 comprises the circuit board 10, the loop antenna 20 formed on the one side 11 of the circuit board 10, the arm part 40 provided as part of the circuit board 10 on the inside of the loop antenna 20, and the IC chip 30 mounted on the arm part 40.

The IC chip 30 comprises the antenna connection terminal 31 for connecting to one end of the loop antenna 20, the antenna connection terminal 32 for connecting to the other end of the loop antenna 20, and the information storage circuit (not shown). The IC chip 30 performs radio communication of information in the information storage circuit via the loop antenna 20.

The loop antenna 20 is made of a conducting wire and is arranged in a spiral form along the outer peripheral sides of the circuit board 10. The end located inside the loop antenna 20 (hereinafter, referred to as an inner end) has the pad part 22, and the end located outside the loop antenna 20 (hereinafter, referred to as an outer end) has the pad part 21.

The arm part 40 is provided with the IC chip 30 and also comprises the pad part 41, the pad part 42, the conducting wire 43, and a conductive pattern of traces 48 formed on the one side 11. The arm part 40 is removably provided as part of the circuit board 10. Since the pad part 41 is provided so as to correspond to the pad part 21, collapsing the arm part 40 causes the pad part 41 to contact the pad part 21, as shown in FIG. 10. When the arm part 40 is collapsed, the pad parts 41 and 21 are joined together by piercing the pad part 41 with part of the pad part 21. Also, since the pad part 42 is provided so as to correspond to the pad part 22, collapsing the arm part 40 causes the pad part 42 to contact the pad part 22. When the arm part 40 is collapsed, the pad parts 42 and 22 are joined together by piercing the pad part 42 with part of the pad part 22. The fold of the folding part 50 is half-punched or perforated so that the folding part 50 is easily folded for removing the arm part 40 and that the arm part 40 is easily removed from the circuit board 10.

The conducting wire 43 connects the pad part 41 to the antenna connection terminal 31 of the IC chip 30, and the antenna connection terminal 32 of the IC chip 30 is connected to the pad part 42.

The conductive pattern 48 is made of the same materials as the pad part 42 and is arranged so as to protrude from the pad part 42 in a linear form. When the arm part 40 is collapsed, a capacitor is formed by the conductive pattern 48 and a portion of the loop antenna 20 that faces the conductive pattern 48. Also, the insulating layer 45 is formed on the conducting wire 43 and the conductive pattern 48. The insulating layer 45 is made of a member that may function as a dielectric and is attached to a portion of each of the conducting wire 43 and the conductive pattern 48 that contacts the loop antenna 20 when the arm part 40 is collapsed.

After collapsing the arm part 40, the magnetic core 47 is installed on the circuit board 10 along the rim of the removal hole 46. The magnetic core 47 can be formed by applying a mixture of adhesive materials and magnetic materials (for example, copper foil or aluminum foil) that have a magnetic permeability higher than atmosphere to one side of tape constituting the magnetic core 47, as shown in FIG. 5 for the explanation of the first embodiment or in FIG. 12 for the explanation of the second embodiment. The magnetic core 47 is installed so as to sandwich part of the circuit board 10, as shown in FIGS. 13 and 14.

The operation according to this embodiment will now be described.

Since collapsing the arm part 40 causes the contact between the pad part 41 and the pad part 21 and the contact between the pad part 42 and the pad part 22, the outer end of the loop antenna 20 is electrically connected to the antenna connection terminal 31 of the IC chip 30 through the pad parts 21, 41 and the conducting wire 43, and the inner end of the loop antenna 20 is electrically connected to the antenna connection terminal 32 of the IC chip 30 through the pad parts 22 and 42. Furthermore, the conductive pattern 48 contacts part of the loop antenna 20 with the insulating layer 45 therebetween. Thus, a capacitor is formed by the conductive pattern 48 and the part of the loop antenna 20, which function as electrodes.

After the connection, the pad part 21 and the pad part 41 are joined together by piercing the pad part 41 with part of the pad part 21, and the pad part 22 and the pad part 42 are joined together by piercing the pad part 42 with part of the pad part 22, as shown in FIG. 14. By such a joint, the IC chip 30 is connected to the loop antenna 20. Thus, radio communication of information in the information storage circuit is performed by the IC chip 30 via the loop antenna 20.

Figure 15:
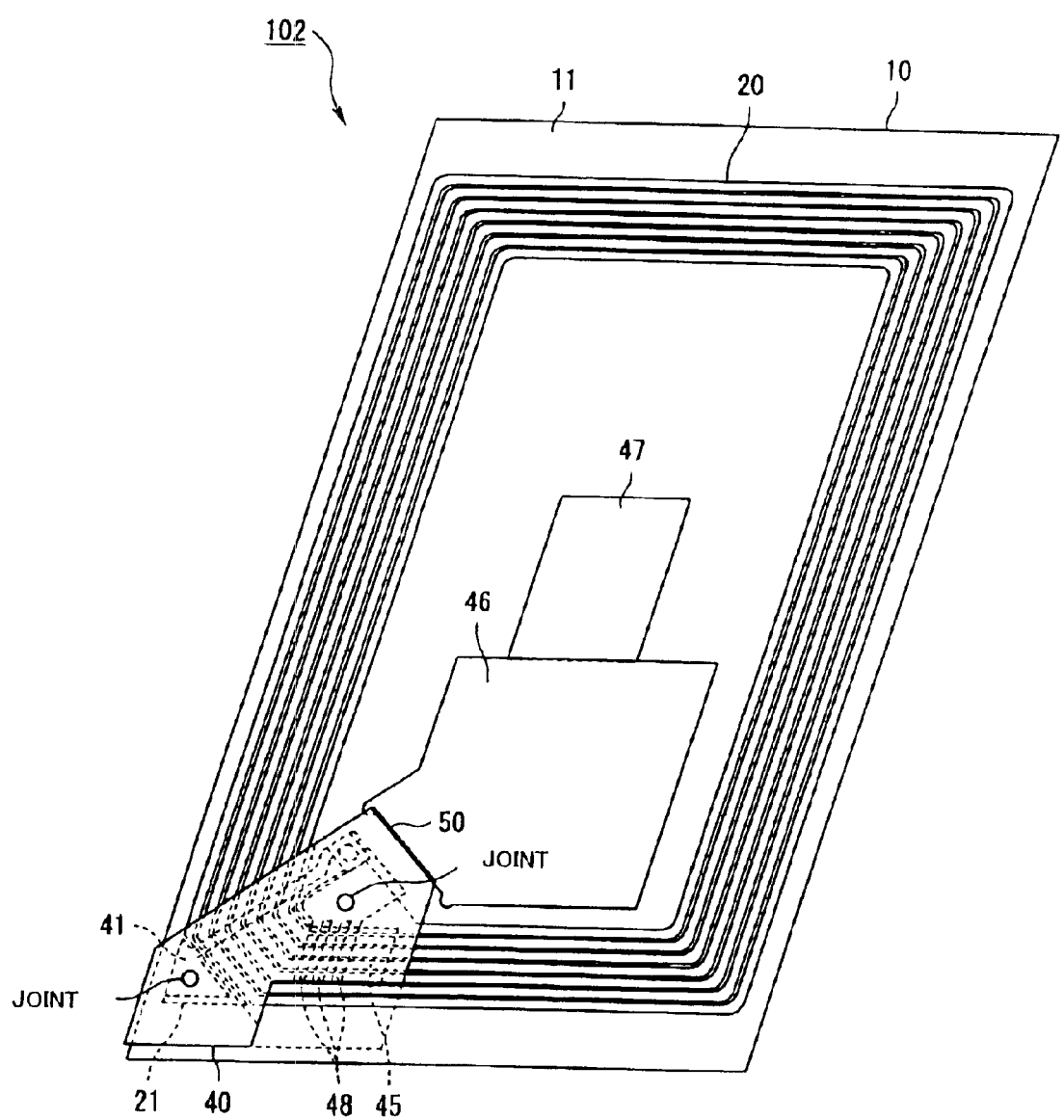
FIG. 15 shows an example of the RFID non-contact IC tag 102 when part of conductive pattern 48 is removed.

FIG. 15 shows an example of the RFID non-contact IC tag 102 when part of the conductive pattern 48 is removed.

In this embodiment, part of the conductive pattern 48 of the arm part 40 can be removed, and the capacitance of the capacitor of the IC chip 30 can be adjusted by removing part of the conductive pattern 48, as shown in FIG. 15. The adjustment of the capacitance enables adjustment of the resonance frequency of the IC chip 30. Furthermore, adjusting the resonance frequency enables the sharpness (Q) of the resonance circuit to be properly adjusted. Thus, in the process of production or the like, the capacitance can be adjusted to some extent so that the resonance circuit exhibits a desired Q value.

Figure 16:
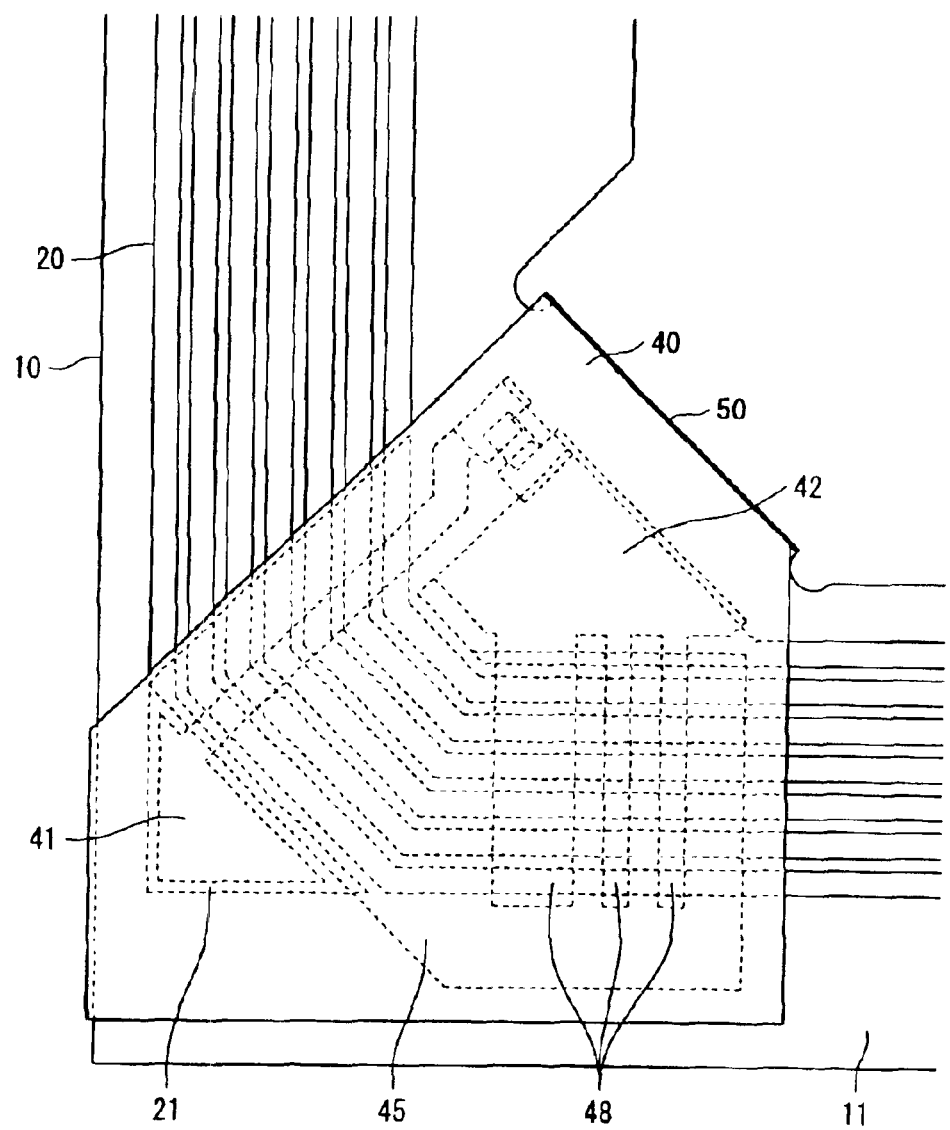
FIG. 16 shows an example of the shape of the conductive pattern 48.
Figure 17:
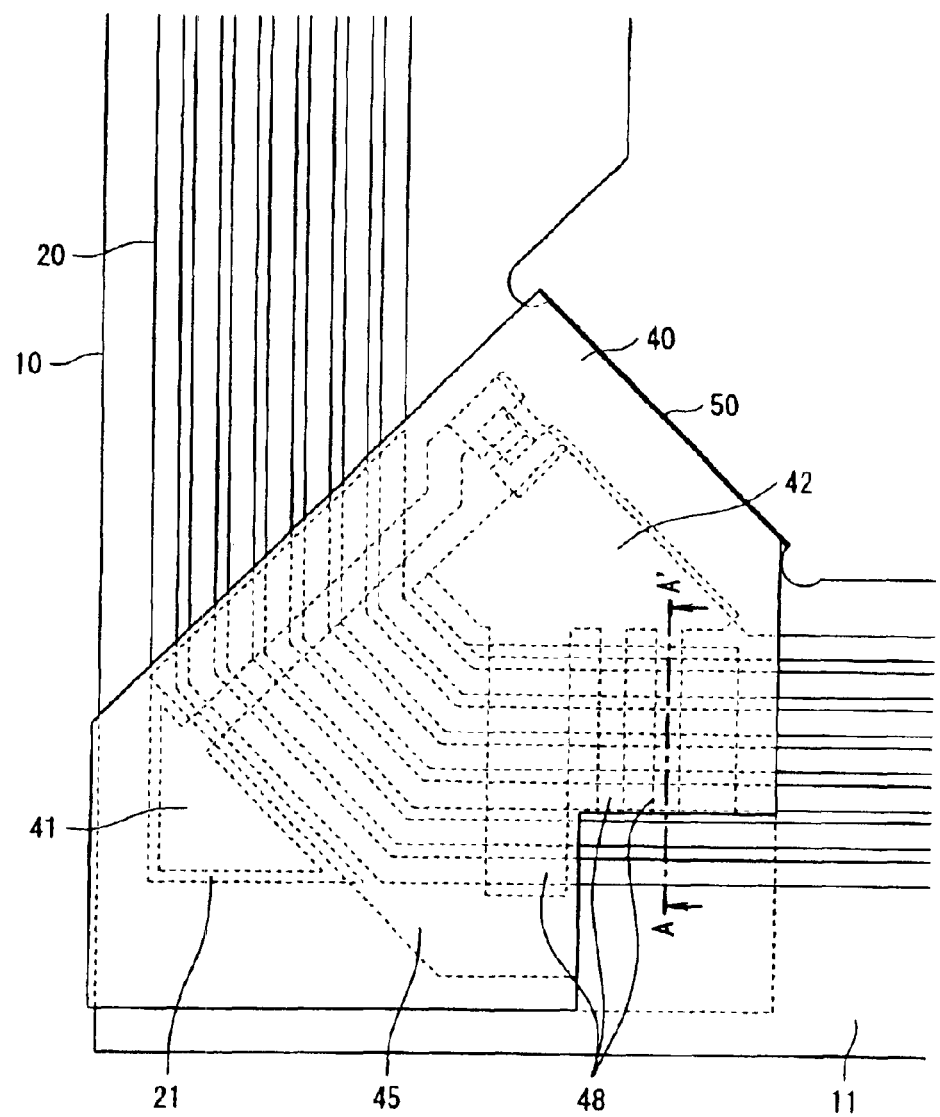
FIG. 17 shows a state when part of the conductive pattern 48 shown in FIG. 16 is removed.

FIG. 16 shows an example of the shape of the conductive pattern 48, and FIG. 17 shows a state when part of the conductive pattern 48 shown in FIG. 16 is removed.

As shown in FIG. 16, by arranging the conductive pattern 48 in a linear form and by changing the width of the conductive pattern 48, the capacitance of the capacitor can be finely adjusted in accordance with a position or length to be removed. More specifically, as shown in FIG. 17, removing only a leading end portion of each of the two right-hand traces of the conductive pattern 48 and thus slightly reducing a portion of the conductive pattern 48 that faces the loop antenna 20 enables the capacitance of the capacitor to be finely adjusted.

Concerning a method for cutting the conductive pattern 48, since dispersion of the IC chip 30 and the antenna pattern is stable within a lot, part of the conductive pattern 48 is also set to a removal position and is cut when a pattern of the arm part 40 of the tag is removed. When the arm part 40 is removed, patterns corresponding to respective capacitances may be nested. Alternatively, patterns set in positions in accordance with capacitances may be separately prepared in a case where an inexpensive Thomson mold or the like is used.

Also, in a case where the capacitance of the capacitor is adjusted after the pattern of the arm part 40 is removed, since only one side is held, for example, a pattern prepared for the traces must be removed by using a pattern of the perimeter of the arm part 40 or by providing a location hole or the like while attracting the tag and the bridge part thereof.

Furthermore, for cutting the conductive pattern 48, since the capacitance of the capacitor is determined in accordance with traces of part of the loop antenna 20 and the traces of the conductive pattern 48, the traces of the part of the loop antenna 20 may be arranged in such a manner that a clearance provided between the traces of the part of the loop antenna 20 is wider than that provided between the traces of the other parts of the loop antenna 20 not overlapping the conductive pattern 48. Such an arrangement increases acceptable ranges of variation in cutting and misalignment after the cutting, thus being advantageous.

Also, the width of the traces of the overlap part of the conductive pattern 48 may be different from the width of the traces of a non-overlap part of the conductive pattern 48, and notches may be provided near the center of the traces of the non-overlap part. Accordingly, finished conditions can be easily checked by visual observation in the process of cutting. Also, in a case where the frequency must be adjusted by manually cutting the pattern, changing the widths of the traces or providing a notch gives a guide, thus achieving easy machining.

Figure 18:
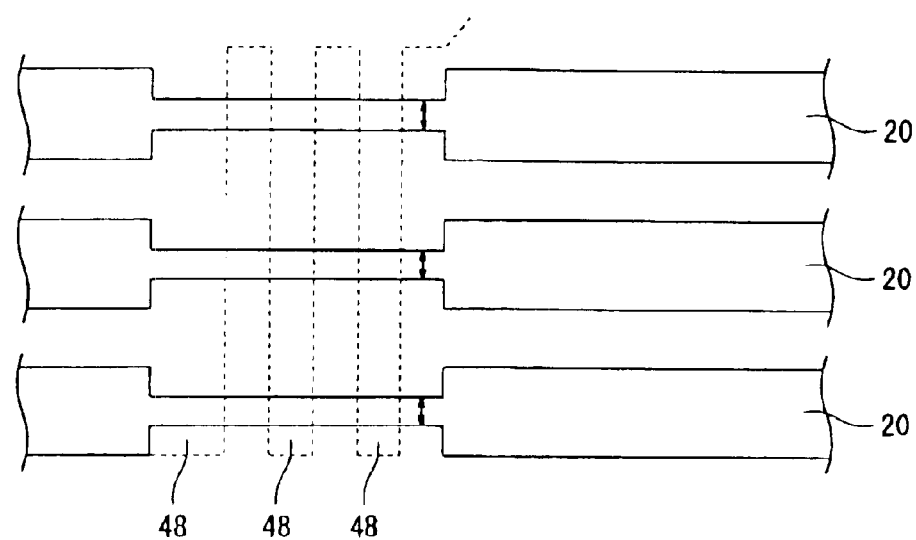
FIG. 18 shows an example for adjusting a capacitance in accordance with the width of traces of the loop antenna 20.

FIG. 18 shows an example for adjusting the capacitance in accordance with the width of the traces of the loop antenna 20.

As shown in FIG. 18, an adjustment range of the capacitance of the capacitor can be determined by changing the width of the traces of the loop antenna 20 that faces the conductive pattern 48.

Figure 19:
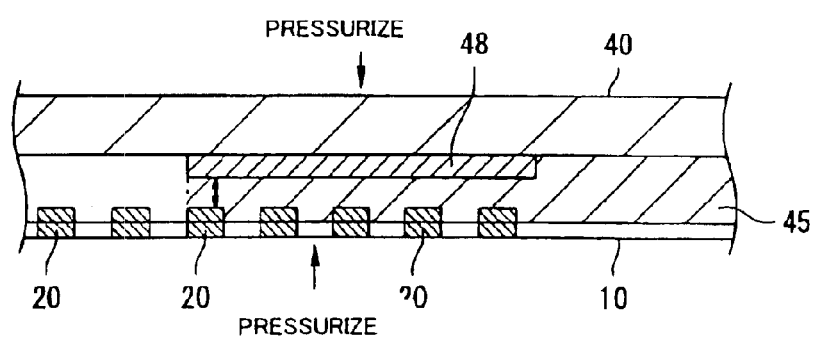
FIG. 19 shows an example for bonding the arm part 40 by means of heat and pressure treatment.

FIG. 19 shows an example for bonding the arm part 40 by heat and pressure treatment.

The insulating layer 45 shown in FIG. 19 is made of materials having adhesive properties. Collapsing the arm part 40 and then pressurizing and heating the arm part 40 causes the adhesion materials constituting the insulating layer 45 to be melted. Then, cooling the melted adhesion materials allows the arm part 40 to be adhered to the circuit board 10 with the insulating layer 45 therebetween. Here, the thickness of the insulating layer 45 between the arm part 40 and the circuit board 10 is made uniform by performing the pressurization treatment while heating. In this process, a process for joining the arm part 40 to the circuit board 10 by piercing the arm part 40 with part of the circuit board 10 may be performed at the same time.

If the insulating layer 45 is not made of materials having adhesive properties, the arm part 40 and the circuit board 10 are joined together by piercing the arm part 40 with part of the circuit board 10.

For recycling, the joints are removed and the arm part 40 joined to the circuit board 10 is pulled by pinching a leading edge of the arm part 40, so that the arm part 40 is removed from the circuit board 10. Here, this operation is made easier by providing the notch 60, as in the second embodiment. After removing the arm part 40 from the circuit board 10, the circuit board 10 is recycled and the arm part 40 is disposed of.

Accordingly, in this embodiment, a capacitor is formed by the conductive pattern 48 provided on the arm part 40 and the loop antenna 20 provided on the circuit board 10. Thus, a predetermined resonance frequency can be achieved together with the capacitor part of the IC chip 30.

Thus, the area of an antenna surface is wider than a case where capacitors are arranged on the front and back of a circuit board. Therefore, the reduction in the communication quality can be suppressed.

Furthermore, part of the conductive pattern 48 is removable.

Thus, the capacitance of the capacitor formed by the conductive pattern 48 provided on the arm part 40 and the loop antenna 20 provided on the circuit board 10 can be adjusted. Also, the area of a portion where the conductive pattern 48 overlaps the loop antenna 20 can be finely adjusted by arranging the partly removable conductive pattern 48 in a linear form or the like.

Furthermore, the IC chip 30 is mounted on the arm part 40.

Thus, for recycling, the IC chip 30 can be removed from the circuit board 10 by merely removing the entire arm part 40 from the circuit board 10. Thus, recycling can be performed more easily than the conventional examples.

Furthermore, in this embodiment, the loop antenna 20 is formed on the one side 11 of the circuit board 10, and the arm part 40 that is provided with the IC chip 30 and that also comprises the pad part 41, the pad part 42, the conducting wire 43, and the conductive pattern 48 is collapsibly provided in such a manner that, when the arm part 40 is collapsed, the outer end of the loop antenna 20 contacts the pad part 41 and the inner end of the loop antenna 20 contacts the pad part 42.

Thus, since there is no need to provide a conducting wire at the folding part 50 of the arm part 40, the possibility of cracking in the loop antenna 20 can be reduced as compared with the conventional examples. Also, in view of production, merely forming the pad parts 21, 22, 41, and 42, the conducting wire 43, the conductive pattern 48, and the loop antenna 20 on the one side 11 of the circuit board 10 simplifies the production process and achieves a production relatively easier than the conventional examples.

Furthermore, in this embodiment, the insulating layer 45 is formed on the conducting wire 43 and the conductive pattern 48.

Thus, the possibility of electrical connection between the loop antenna 20 and each of the conducting wire 43 and the conductive pattern 48 when the arm part 40 is collapsed can be reduced.

Also, since the conductive pattern 48 is made of materials which may function as a dielectric, a capacitor can be formed at a portion where the conductive pattern 48 faces the loop antenna 20.

Furthermore, in this embodiment, the outer end of the loop antenna 20 is arranged as the pad part 21, and the inner end of the loop antenna 20 is arranged as the pad part 22.

Thus, since the outer end of the loop antenna 20 is electrically connected to the pad part 41 due to the contact of the pads, the conduction between the outer end of the loop antenna 20 and the pad part 41 is relatively ensured. Also, since the inner end of the loop antenna 20 is electrically connected to the pad part 42 due to the contact of the pads, the conduction between the inner end of the loop antenna 20 and the pad part 42 is relatively ensured.

Furthermore, in this embodiment, the arm part 40 is provided inside of the loop antenna 20.

Thus, in a case where a plurality of circuit boards 10 is cut out from a single circuit board, more circuit boards 10 can be cut out from the single circuit board than a case where circuit boards having the structure in which the arm part 40 is formed outside the RFID non-contact IC tag 102 are cut out from a single circuit board with the same size.

Furthermore, in this embodiment, the arm part 40 is removably formed as part of the circuit board 10.

Thus, the arm part 40 can be produced integrally with the circuit board 10. Therefore, further easier production can be achieved.

Furthermore, in this embodiment, the magnetic core 47 is installed on the circuit board 10 along the rim of the removal hole 46 formed in the circuit board 10 when the arm part 40 is collapsed.

Thus, the inductance of the loop antenna 20 can be increased.

In the first embodiment, the IC chip 30 corresponds to a communication circuit according to Invention 1, 8, or 9. The antenna connection terminals 31 and 32 and the pad part 22 correspond to antenna connection parts according to Invention 1 or 3. The pad part 41 corresponds to a first pad part according to Invention 1, and the pad part 42 corresponds to a second pad part according to Invention 1 or 3. Also, the conducting wire 43 corresponds to a conducting part according to Invention 1 or 2, and the RFID non-contact IC tag 100 corresponds to a non-contact communication medium according to Inventions 1 to 9.

In the second embodiment, the IC chip 30 contains a communication circuit corresponding to a communication circuit according to Invention 10, 11, or 19. The antenna connection terminal 31 corresponds to a first antenna connection part according to Invention 10 or 11, and the antenna connection terminal 32 corresponds to a second antenna connection part according to Invention 10 or 11. The pad part 41 corresponds to a first pad part according to Invention 11, and the pad part 42 corresponds to a second pad part according to Invention 11. Also, the conducting wire 43 corresponds to a conducting part according to Invention 11 or 14, and the RFID non-contact IC tag 100 corresponds to a non-contact communication medium according to Inventions 10 to 19.

In the third embodiment, the IC chip 30 corresponds to a communication circuit according to Invention 20, 25, or 31. The antenna connection terminals 31 and 32 and the pad part 22 correspond to antenna connection parts according to Invention 20 or 24. The pad part 41 corresponds to a first pad part according to Invention 20, and the pad part 42 corresponds to a second pad part according to Invention 20 or 24. Also, the conducting wire 43 corresponds to a conducting part according to Invention 20 or 23. The conductive pattern 48 corresponds to a conductive pattern according to Invention 20, 21, or 22, and the RFID non-contact IC tag 102 corresponds to a non-contact communication medium according to Inventions 20 to 31.

Although, in the first embodiment, the heat-radiating material 44 is provided at a position of the arm part 40 where the arm part 40 overlaps the IC chip 30 when the arm part 40 is collapsed, a heat-absorbing material may be provided at a position of the arm part 40 where the arm part 40 overlaps the IC chip 30 when the arm part 40 is collapsed.

Also, in the first embodiment, although the non-contact communication medium according to the present invention is applied to the RFID non-contact IC tag 100, as shown in FIG. 1, the non-contact communication medium according to the present invention is not limited to this. The present invention is also applicable to any case without departing from the spirit and the scope thereof.

Although, in the second embodiment, a case where the arm part 40 is reinstalled after removing the arm part 40 from the circuit board 10 is not especially described, not only in a case where recycling is required but also in a case where there is any problem in the loop antenna 20, removing the arm part 40 and using it with another loop antenna 20 is necessary. In such a case, it is preferable that, after removing the arm part 40 from the circuit board 10, the conducting wire 43 be exposed and the arm part 40 be reinstalled on the circuit board 10 by means of joint by piercing or contact-bonding.

Although, in the second embodiment, the arm part 40 is provided inside of the loop antenna 20, the arm part 40 is not necessarily provided in such a position. The arm part 40 may be provided outside of the loop antenna 20.

Although, in the second embodiment, the non-contact communication medium according to the present invention is applied to the RFID non-contact IC tag 101, as shown in FIG. 6, the non-contact communication medium according to the present invention is not limited to this. The present invention is also applicable to any case without departing from the spirit and the scope thereof.

Although, in the third embodiment, the conductive pattern 48 is arranged in a linear form, the conductive pattern 48 is not necessarily arranged in a linear form. The conductive pattern 48 may be arranged in another form.

Although, in the third embodiment, the arm part 40 is provided inside of the loop antenna 20, the arm part 40 is not necessarily provided in such a position. The arm part 40 may be provided outside of the loop antenna 20.

Although, in the third embodiment, the non-contact communication medium according to the present invention is applied to the RFID non-contact IC tag 102, as shown in FIG. 13, the non-contact communication medium according to the present invention is not limited to this. The present invention is also applicable to any case without departing from the spirit and the scope thereof.

The entire disclosure of Japanese Patent Application Nos. 2002-312765 filed Oct. 28, 2002, 2003-003325 filed Jan. 9, 2003, and 2003-163979 filed Jun. 9, 2003 are incorporated by reference.

What is claimed is:

1. A non-contact communication medium comprising:
   a conductive loop antenna formed on one side of a circuit board; and
   a communication circuit mounted on the one side of the circuit board,
   wherein one end of the loop antenna is connected to one antenna connection part of the communication circuit, and
   wherein an arm part provided with a first pad part, a second pad part, and a conducting part for allowing conduction between the first pad part and the second pad part is collapsibly provided such that, when the arm part is collapsed, the other end of the loop antenna contacts the first pad part and the other antenna connection part of the communication circuit contacts the second pad part.

2. A non-contact communication medium according to claim 1,
   wherein a portion of the conducting part that contacts the loop antenna when the arm part is collapsed is insulated.

3. A non-contact communication medium according to claim 1,
   wherein the other end of the loop antenna comprises a third pad part, and
   wherein a portion of the other antenna connection part that contacts the second pad part when the arm part is collapsed comprises a fourth pad part.

4. A non-contact communication medium according to claim 1,
   wherein the arm part is provided inside of the loop antenna.

5. A non-contact communication medium according to claim 4,
   wherein the arm part is removably formed as part of the circuit board.

6. A non-contact communication medium according to claim 5,
   wherein a magnetic core is installed in a removal hole of the arm part, the removal hole being formed in the circuit board when the arm part is collapsed.

7. A non-contact communication medium according to claim 6,
   wherein the magnetic core comprises a magnetic material having a magnetic permeability higher than atmosphere.

8. A non-contact communication medium according to claim 1,
   wherein the communication circuit is mounted in a position of the one side of the circuit board that overlaps the arm part when the arm part is collapsed, and
   wherein at least one of a heat-radiating material and a heat-absorbing material is provided in a position of the arm part that overlaps the communication circuit when the arm part is collapsed.

9. A non-contact communication medium according to claim 1,
   wherein the communication circuit comprises an information storage circuit that communicates information in the information storage circuit.

10. A non-contact communication medium comprising:
    a circuit board;
    a conductive loop antenna formed on the circuit board;
    an arm part that is removable from the circuit board by a removal hole such that one end of a part of the circuit board is remaining, the arm part being collapsible by the remaining one end functioning as a folding part;
    a communication circuit mounted on the arm part;
    a first pad part formed on the same side of the circuit board as the side on which the communication circuit of the arm part is mounted;
    a second pad part formed on the same side of the circuit board as the side on which the communication circuit of the arm part is mounted, such that the second pad part is connected to a second antenna connection part;
    a conducting part for allowing conduction between a first antenna connection part and the first pad part;
    a third pad part formed at an end of the circuit board located outside the loop antenna; and
    a fourth pad part formed at an end of the circuit board located inside the loop antenna,
    wherein the arm part is provided such that, when the arm part is collapsed, the first pad part contacts the third pad part and the second pad part contacts the fourth pad part.

11. A non-contact communication medium according to claim 10,
    wherein when the arm part is collapsed, the arm part and the circuit board are joined together by piercing the arm part with part of the circuit board.

12. A non-contact communication medium according to claim 10,
    wherein, when the arm part is collapsed and is joined to the circuit board, a notch formed at an outer edge of the joined portion of the circuit board is provided.

13. A non-contact communication medium according to claim 10,
    wherein an insulation part is provided at a portion of the conducting part that contacts the loop antenna when the arm part is collapsed.

14. A non-contact communication medium according to claim 10,
    wherein the arm part is provided inside of the loop antenna.

15. A non-contact communication medium according to claim 14, wherein the arm part is removably formed as part of the circuit board.

16. A non-contact communication medium according to claim 15,
wherein, when the arm part is collapsed, a magnetic core is provided in the circuit board along the rim of the removal hole of the arm part.

17. A non-contact communication medium according to claim 16,
wherein the magnetic core comprises a magnetic material having a magnetic permeability higher than atmosphere.

18. A non-contact communication medium according to claim 10,
wherein the communication circuit comprises an information storage circuit that communicates information in the information storage circuit.

19. A non-contact communication medium comprising:
a conductive loop antenna formed on one side of a circuit board; and
a communication circuit mounted on the one side of the circuit board,
wherein one end of the loop antenna is connected to one antenna connection part of the communication circuit, and
an arm part provided with a first pad part, a second pad part, and a conducting part allowing conduction between the first pad part and the second pad part is collapsibly provided such that, when the arm part is collapsed, the other end of the loop antenna contacts the first pad part and the other antenna connection part of the communication circuit contacts the second pad part, and
wherein a conductive pattern of traces of a predetermined shape is provided on the arm part, and the conductive pattern is arranged such that, when the arm part is collapsed, a capacitor for the communication circuit is formed by the conductive pattern and part of the loop antenna formed on the circuit board.

20. A non-contact communication medium according to claim 19,
wherein the conductive pattern of the predetermined shape is provided such that part of the conductive pattern is removable, and removing part of the conductive pattern allows adjustment of the capacitance of the capacitor.

21. A non-contact communication medium according to claim 20,
wherein part of the partly removable conductive pattern is arranged to be removable in a predetermined shape.

22. A non-contact communication medium according to claim 19,
wherein a portion of the conducting part that contacts the loop antenna when the arm part is collapsed is insulated.

23. A non-contact communication medium according to claim 19,
wherein the other end of the loop antenna comprises a third pad part, and
wherein a portion of the other antenna connection part that contacts the second pad part when the arm part is collapsed comprises a fourth pad part.

24. A non-contact communication medium according to claim 19,
wherein the communication circuit is mounted on the arm part.

25. A non-contact communication medium according to claim 19,
wherein the arm part is provided inside of the loop antenna.

26. A non-contact communication medium according to claim 25,
wherein the arm part is removably formed as part of the circuit board.

27. A non-contact communication medium according to claim 26,
wherein a magnetic core is installed in a removal hole of the arm part, the removal hole being formed in the circuit board when the arm part is collapsed.

28. A non-contact communication medium according to claim 27,
wherein the magnetic core comprises a magnetic material having a magnetic permeability higher than atmosphere.

29. A non-contact communication medium according to claim 19,
wherein when the arm part is collapsed, the arm part and the circuit board are joined together by piercing the arm part with part of the circuit board.

30. A non-contact communication medium according to claim 19,
wherein the communication circuit comprises an information storage circuit communicating information in the information storage circuit.

* * * * *